United States Patent [19]

Tsui

[11] 4,244,048
[45] Jan. 6, 1981

[54] CHIP AND WAFER CONFIGURATION AND TESTING METHOD FOR LARGE-SCALE-INTEGRATED CIRCUITS

[75] Inventor: Frank F. Tsui, Briarcliff Manor, N.Y.

[73] Assignee: International Business Machines Corporation, Armonk, N.Y.

[21] Appl. No.: 974,641

[22] Filed: Dec. 29, 1978

[51] Int. Cl.³ .................... G01R 31/28; G06F 11/00
[52] U.S. Cl. ................................ 371/15; 324/73 R; 371/25
[58] Field of Search ......... 235/302; 324/73 R, 73 PC, 324/73 AT, 158 R; 29/574, 575; 364/900; 371/15, 25

[56] References Cited

U.S. PATENT DOCUMENTS

| | | | |
|---|---|---|---|
| 3,761,695 | 9/1973 | Eichelberger | 235/302 |
| 3,783,254 | 1/1974 | Eichelberger | 364/700 |
| 3,789,205 | 1/1974 | James | 235/302 |
| 3,879,839 | 4/1975 | Logue | 29/574 |
| 4,038,648 | 8/1977 | Chesley | 235/302 |
| 4,063,080 | 12/1977 | Eichelberger et al. | 235/302 |
| 4,074,851 | 2/1978 | Eichelberger et al. | 235/302 |
| 4,139,818 | 2/1979 | Schneider | 324/73 R |

OTHER PUBLICATIONS

Muehldorf et al., Embedded Macro Test Pattern Generation, IBM Technical Disclosure Bulletin, vol. 20, No. 1, Jun. 1977, pp. 197-199.
Howe et al., Troubleshooting Large-Scale Integrated Circuit Units, IBM Technical Disclosure Bulletin, vol. 17, No. 7, Dec. 1974, pp. 1941-1944.
Balasubramanian et al., Testing LSI Memory Arrays etc., IBM Technical Disclosure Bulletin, vol. 17, No. 7, Dec. 1974, pp. 2019-2020.

Primary Examiner—Charles E. Atkinson
Attorney, Agent, or Firm—Roy R. Schlemmer, Jr.

[57] ABSTRACT

A chip-testing method, which allows Large-Scale-Integrated circuit (LSI) logic chips to be tested on wafer without necessitating expensive equipment involving high-precision step-and-repeat mechanisms, and which further allows chips to be tested individually in the connected-on-module environment. The circuit configuration and method are applicable to the testing of LSI-logic chips which may comprise various circuit structures including latches and combinatorial networks in many combinations and which may be fabricated in any circuit technology.

The basic idea is to configure the chips and wafers in such a way that the LSSD provisions already incorporated in the chips can be utilized also for the on-wafer and on-module testing. The arrangements, which can be made with a "cut-away", or "deactivate" or an "extend-usage" approach, include five major extensions in the chip-image design. These are: the incorporation of gating of serial test-data output from the chips, the provision if necessary of supplementary latches on chips, the incorporation of gating of parallel inputs to the chip core, the incorporation of in-chip and/or interchip connections, which can be done in a "self-sufficient" or a "neighbor-assisted" arrangement, and the utilization of chip-layout design for step-and-repeat juxtaposition. In addition to these in-chip extensions, the method requires proper wafer organization and an arrangement of connecting the chip-image array to probe-contact pads on the wafer.

17 Claims, 34 Drawing Figures

L ALONE:
(L = LATCHES)

CN ALONE:
(CN = COMBINATORIAL NETWORKS)

L-CN:

CN-L:

L-CN-L:

CN-L-CN:

MIXTURE:

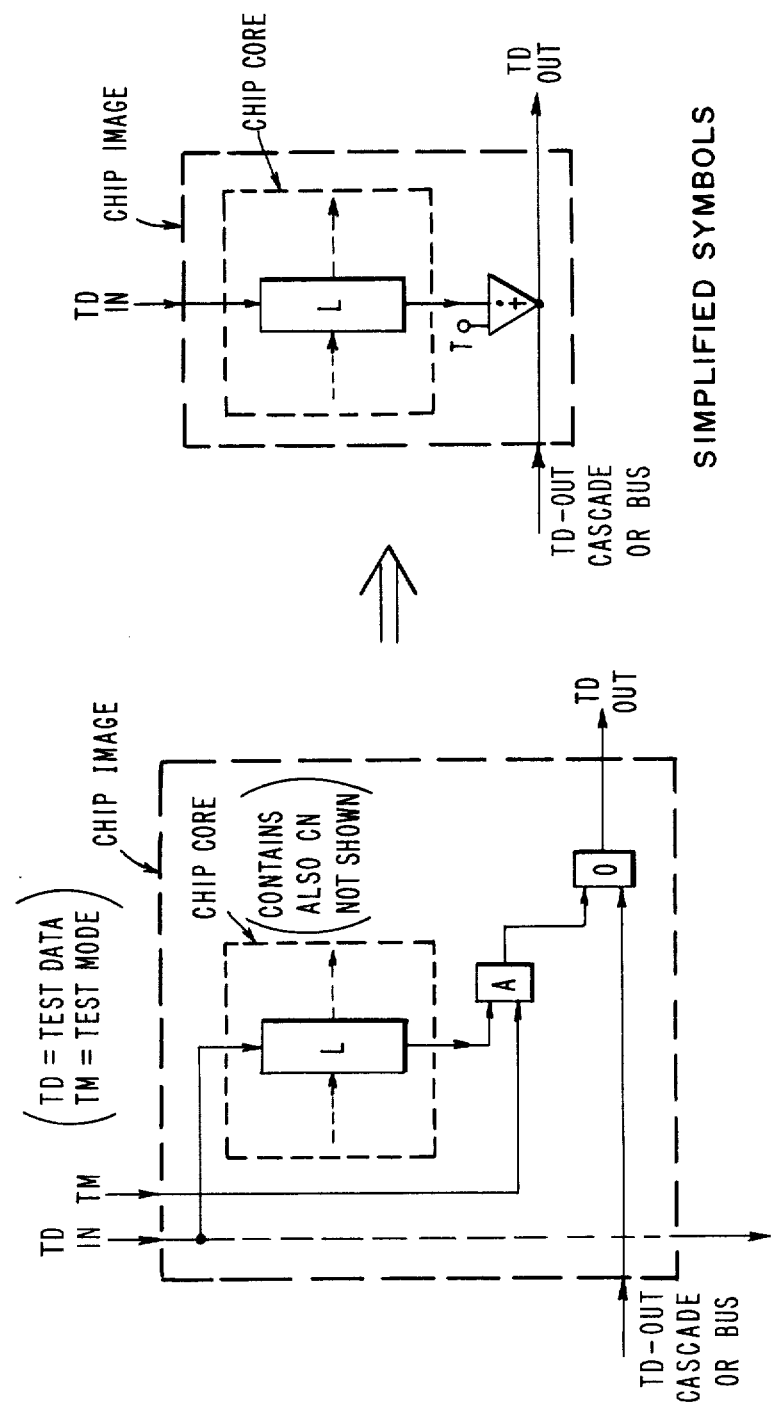

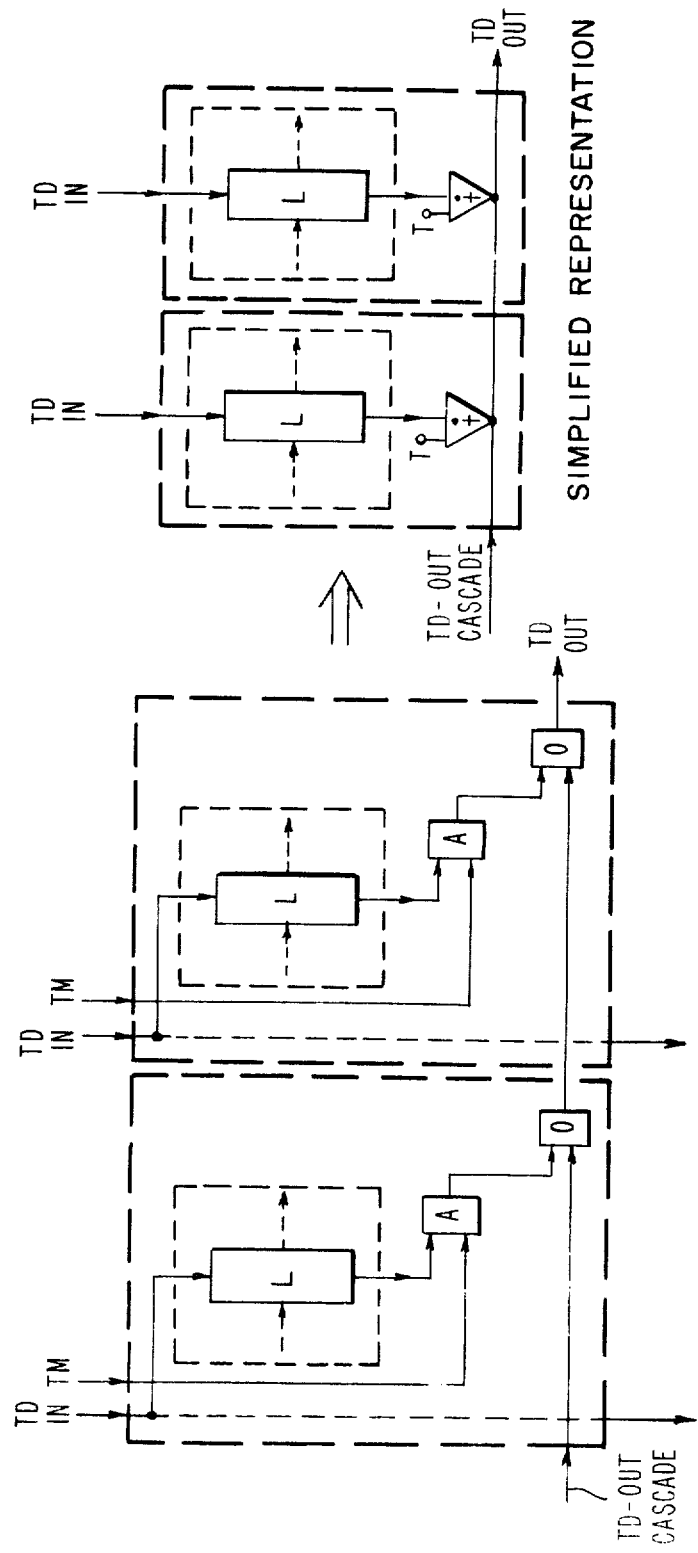

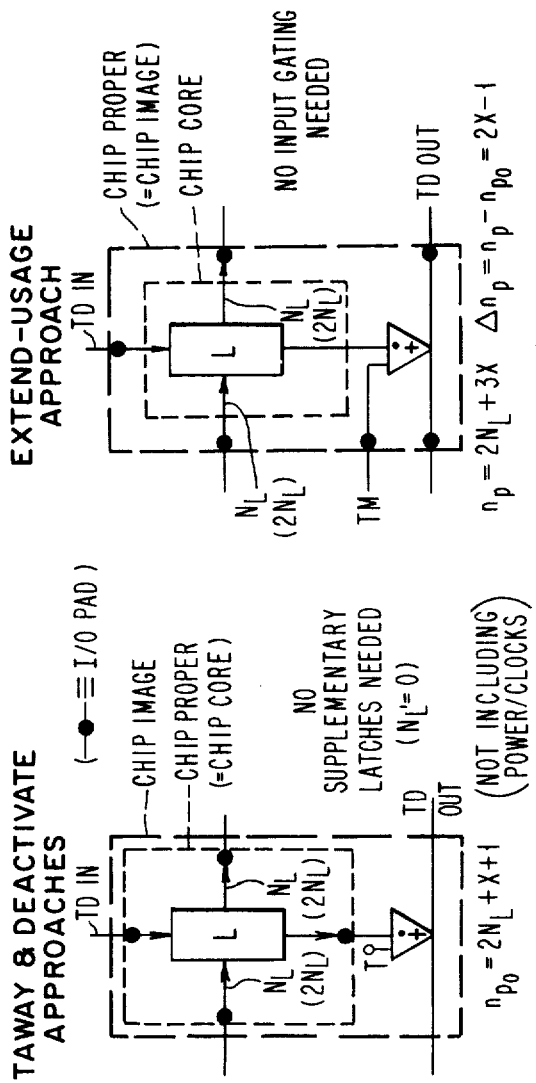
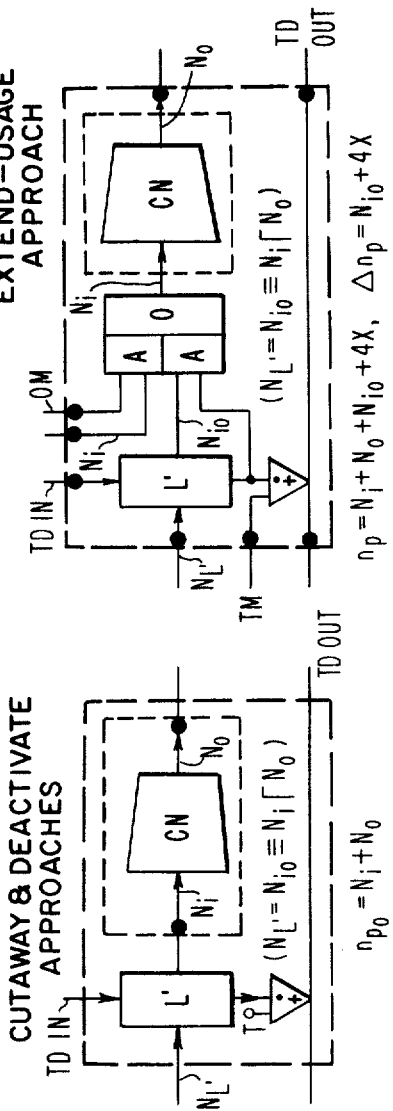

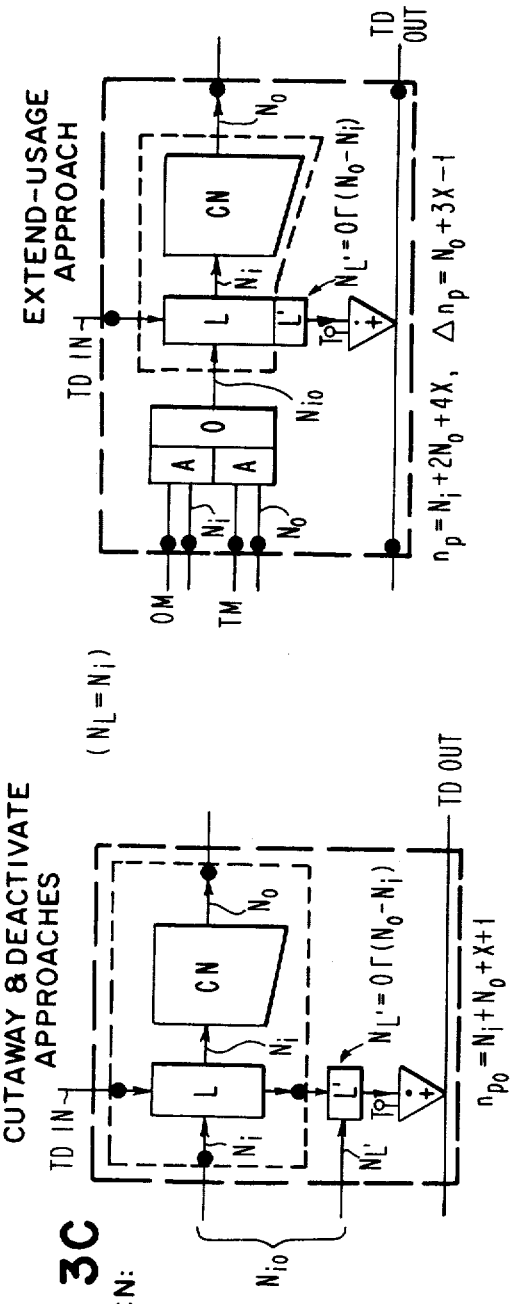
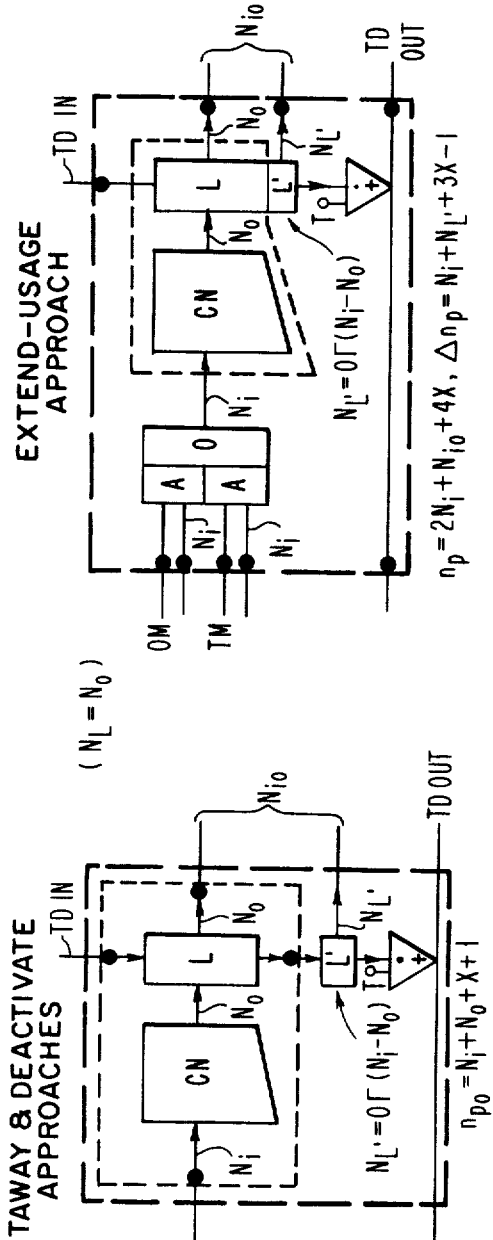
FIG. 3C L-CN:
FIG. 3D CN-L:

CN ALONE:
(NOT COMPATIBLE WITH LSSD CONCEPT)

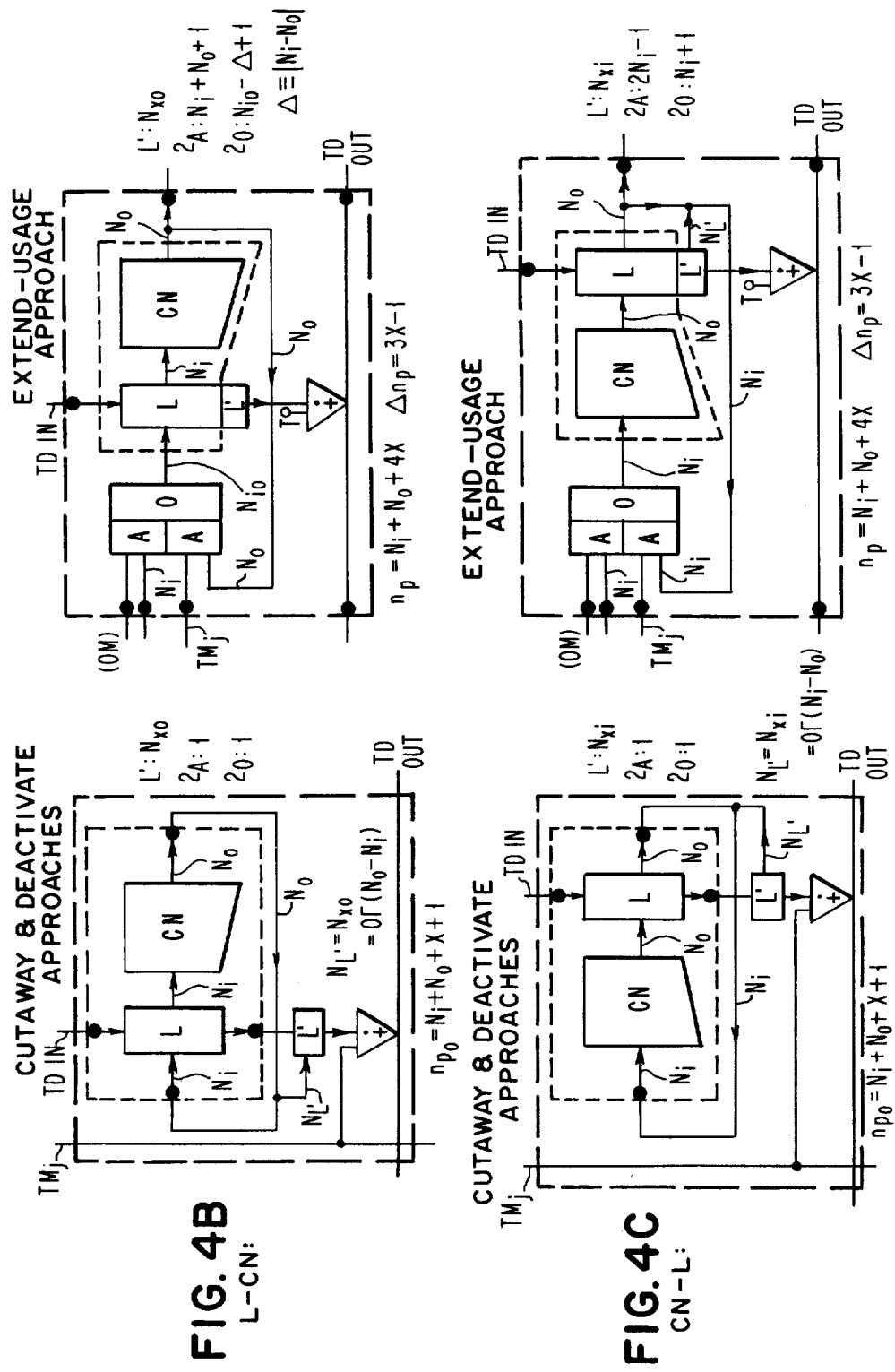
FIG. 4B L-CN:
FIG. 4C CN-L:

ILLUSTRATION OF LATCH-"SHARING" AMONG CIRCUIT GROUPS

▨ SURPLUS OUTPUT CAPACITY
▨ SURPLUS INPUT CAPACITY

✷ NOTE  ALL THESE DASHED LINES ARE SHOWN IN THIS CONFIGURATION ONLY FOR CLARITY. ACTUALLY THESE CONNECTIONS SHOULD GO ALL AROUND & BE OUTSIDE THE CHIP CORE.

* NOTE: ALL THESE DASHED LINES ARE SHOWN IN THIS CONFIGURATION ONLY FOR CLARITY. ACTUALLY THESE CONNECTIONS SHOULD GO ALL AROUND & BE OUTSIDE THE CHIP CORE.

CN ALONE:

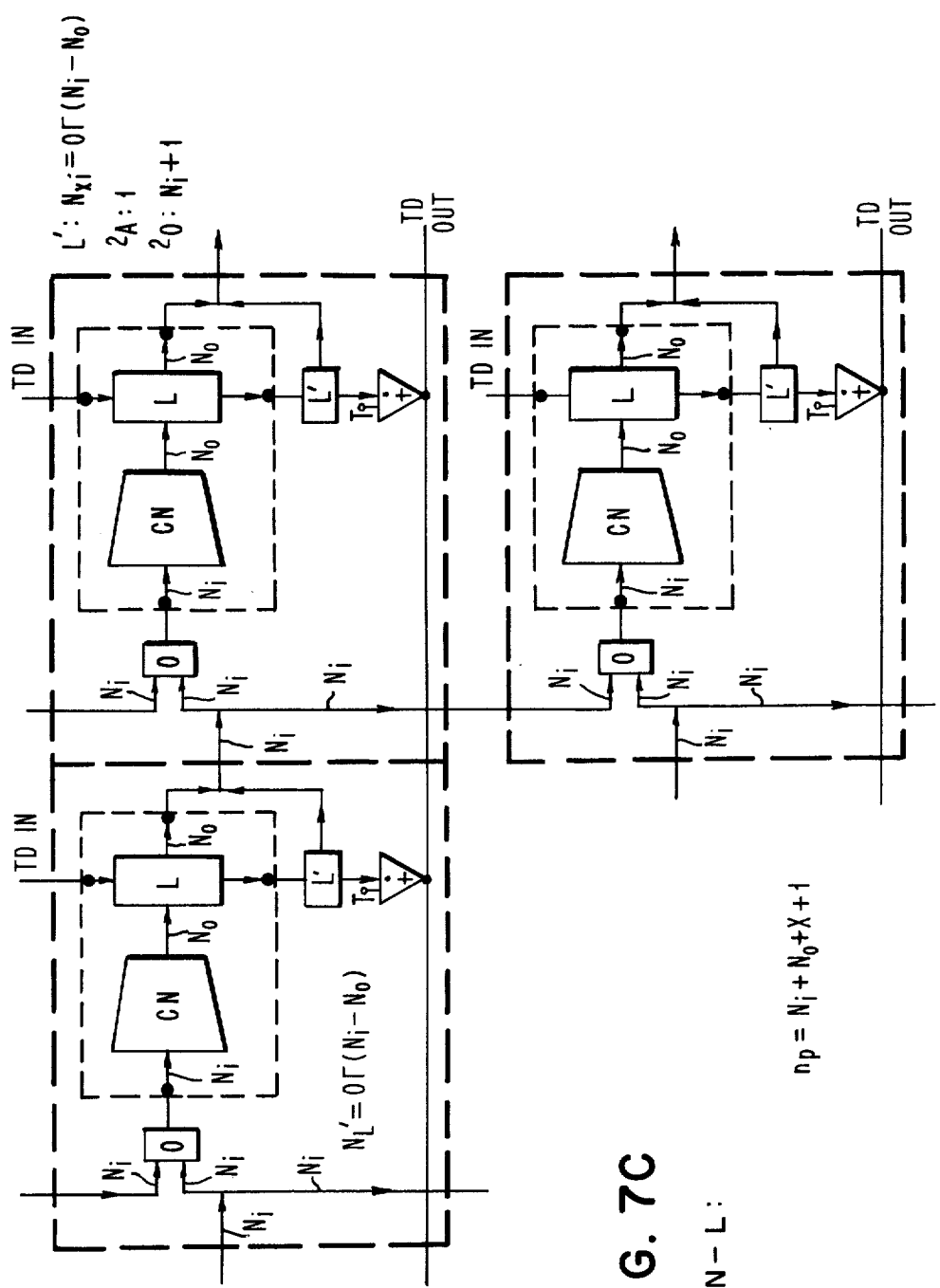

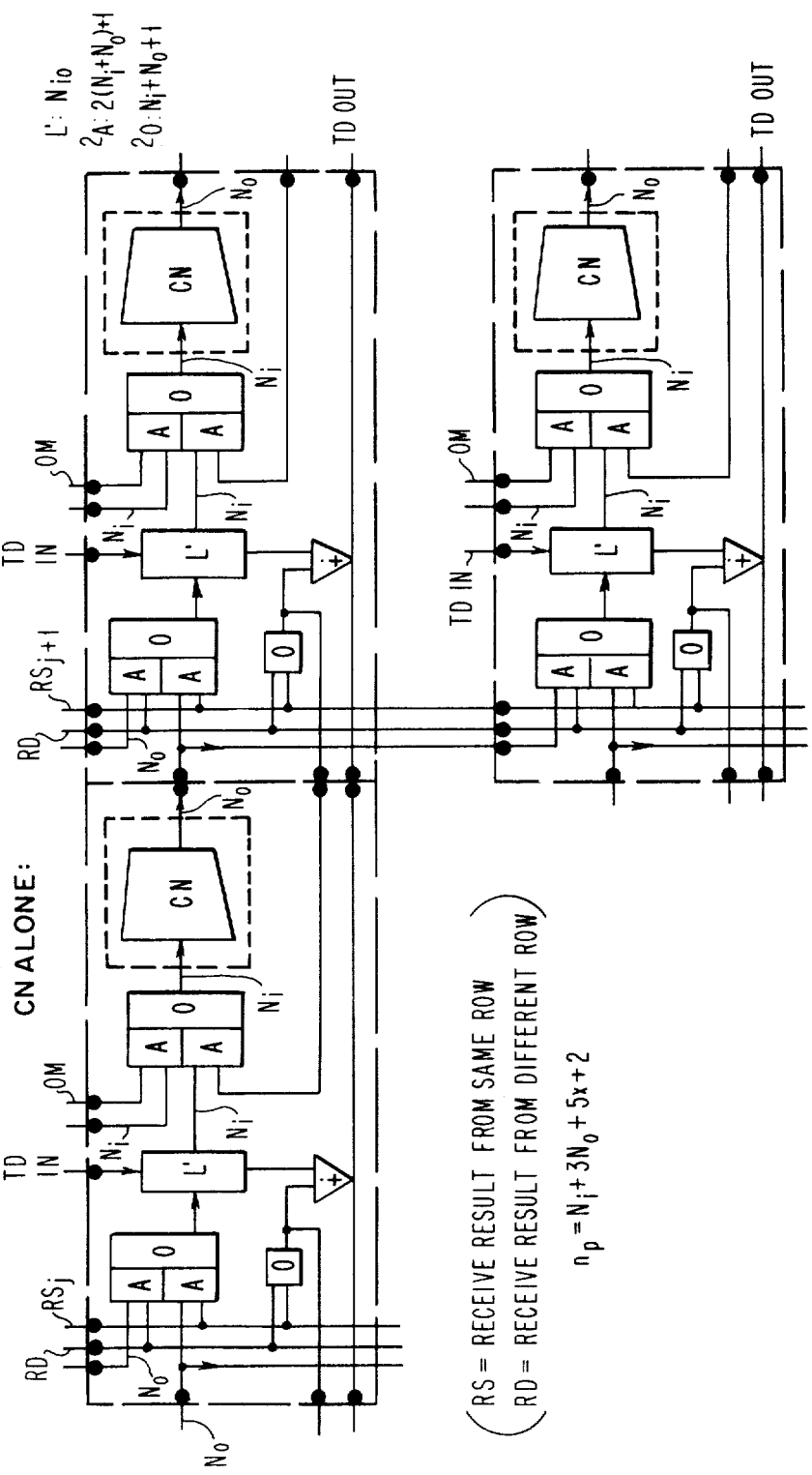

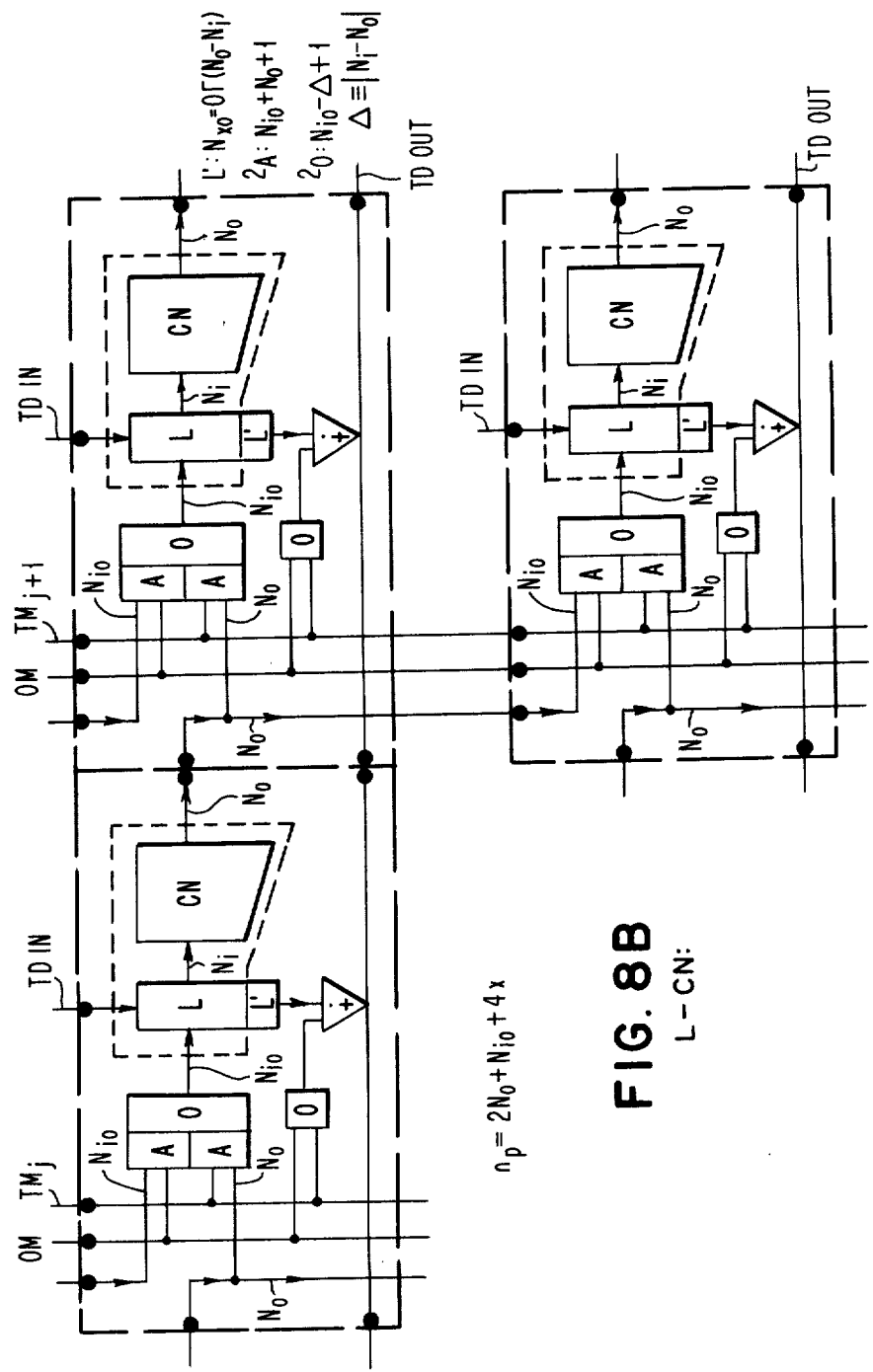

| ARRANGEMENT<br>"GLOBAL" APPROACH<br>INTERCHIP CONNECTION LINES | SELF-SUFFICIENT | | NEIGHBOR-ASSISTED | |
|---|---|---|---|---|
| | CUTAWAY OR DEACTIVATE (FIG. 4 LEFT) | EXTEND-USAGE (FIG. 4 RIGHT) | CUTAWAY OR DEACTIVATE FIG. 7 | EXTEND-USAGE FIG. 8 |
| TEST-DATA SERIAL IN | $\cong M$ | $\cong M$ | $\cong M+1$ | $\cong M+1$ |
| TEST-DATA SERIAL OUT | $M$ | $M$ | $M+1$ | $M+1$ |
| POWER-SUPPLY GROUP LINES | 1 | 1 | $2N+3$ <br> ↓ <br> $(2N+2)$ | 1 |
| TEST-MODE (TM) SELECTION LINES | $N$ | $N$ | | $N+1$ |
| OPERATION-MODE (OM) SEL LINES | 0 | 0 | 0 | $N+1$ |
| TOTAL | $\cong 2M+N+1$ | $\cong 2M+N+1$ | $\cong 2M+2N+5$ | $\cong 2M+2N+5$ |

M = NO. OF CHIP ROWS ≅ NO. OF MULTIPLE FEEDS FOR TEST-DATA SERIAL IN
N = NO. OF CHIP COLUMNS

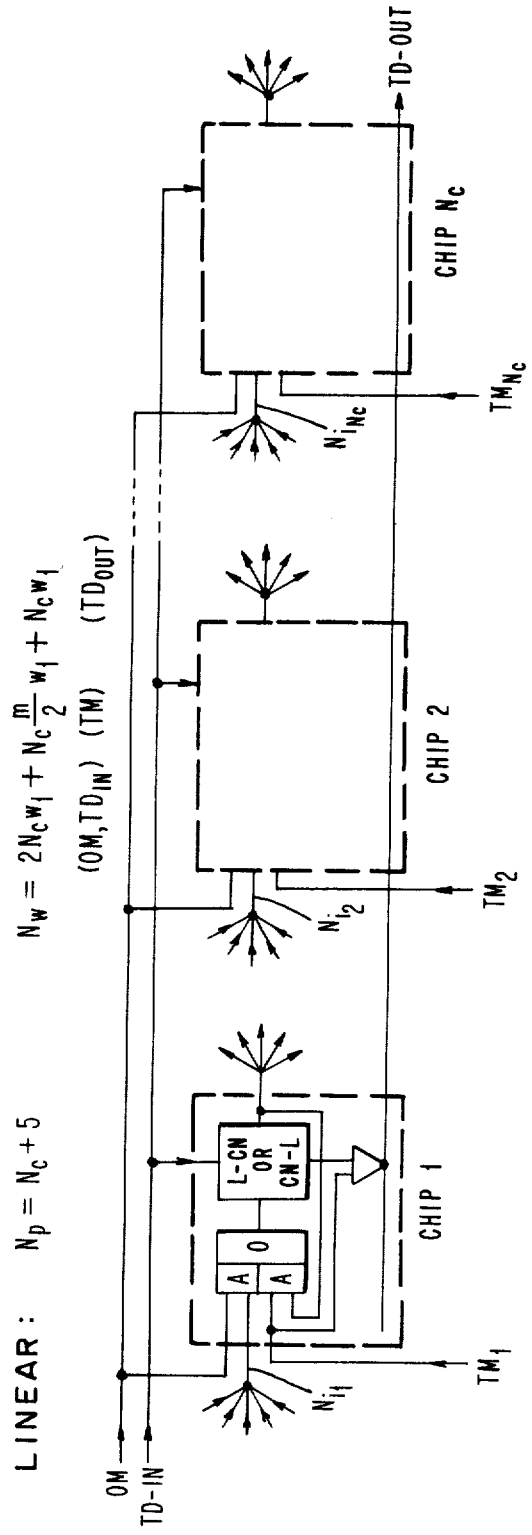

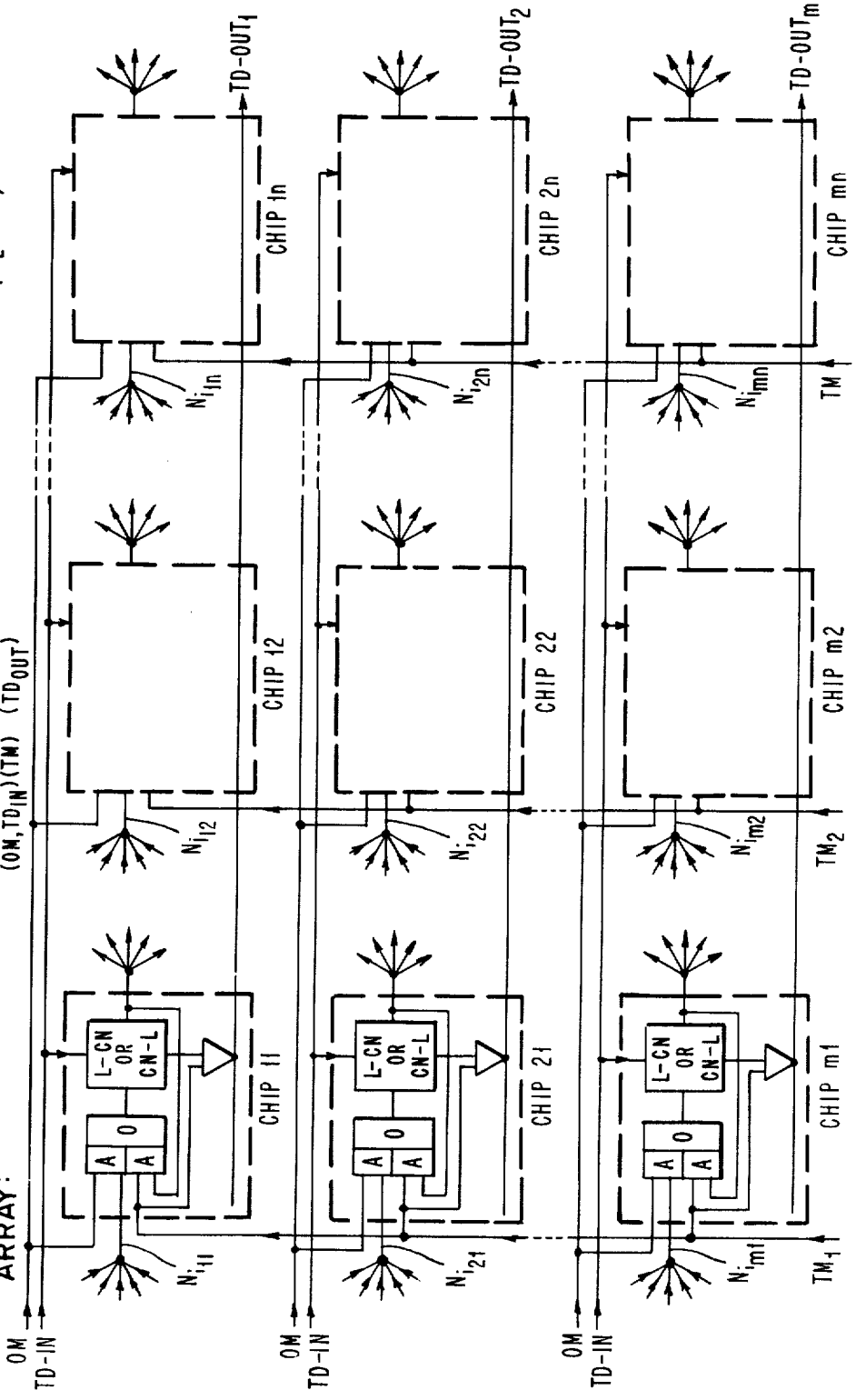

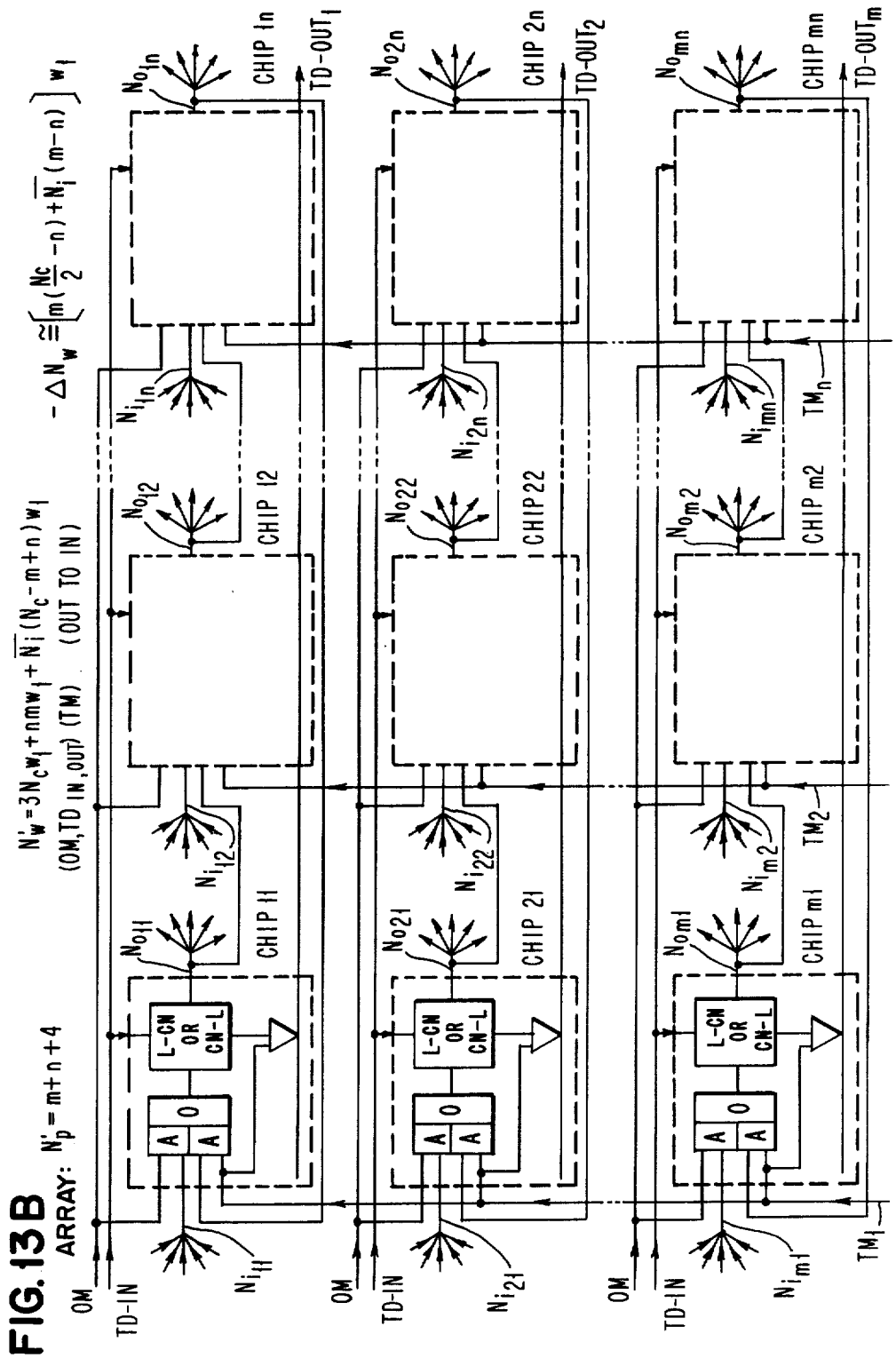

FIG. 14A

FOR ON-WAFER TESTING:

| ARRANGEMENT | | APPROACH | CIRCUIT STRUCTURE | EXTRA CIRCUITRY | | | CHIP-I/O PADS |
|---|---|---|---|---|---|---|---|
| | | | | LATCHES L' | 2-INPUT ANDS 2A | 2-INPUT ORS 2O | |
| SELF SUFFICIENT | | CUTAWAY DEACTIVATE | L–CN<br>CN–L | $N_o - N_i$<br>$N_i - N_o$ | 1<br>1 | 1<br>1 | $N_i + N_o + X + 1$<br>$N_i + N_o + X + 1$ |
| | | EXTEND-USAGE | L–CN<br>CN–L | $N_o - N_i$<br>$N_i - N_o$ | $N_i + N_o + 1$<br>$2N_i + 1$ | $N_{io} - |N_i - N_o| + 1$<br>$N_i + 1$ | $N_i + N_o + 4X$<br>$N_i + N_o + 4X$ |
| NEIGHBOR-ASSISTED | | CUTAWAY DEACTIVATE | L–CN<br>CN–L | $N_o - N_i$<br>$N_i - N_o$ | 1<br>1 | $N_o + 1$<br>$N_i + 1$ | $N_i + N_o + X + 1$<br>$N_i + N_o + X + 1$ |
| | | EXTEND-USAGE | L–CN<br>CN–L | $N_o - N_i$<br>$N_i - N_o$ | $N_{io} + N_o + 1$<br>$N_{io} + N_i + 1$ | $N_{io} - |N_i - N_o| + 1$<br>$N_{io} - |N_i - N_o| + 1$ | $2N_o + N_{io} + 4X$<br>$N_i + 2N_{io} + 4X$ |

(X=1 OR 2)

| ARRANGEMENT<br>COMPARISON | SELF-SUFFICIENT | | NEIGHBOR-ASSISTED |
|---|---|---|---|
| WAFER-CONTACT PADS | $2M + N + 1$ | V | $2M + 2N + 5$ |
| WIRING | LOOPBACK LINES IN CHIP IMAGE | | SIMPLER: NO LOOPBACK LINES |
| WAFER ORGANIZATION | SIMPLER | | ADD TRUNCATE-IMAGE ROWS, COLS |
| USE FOR ON-MODULE TEST | EASIER | | CORRELATION W. OTHER CHIPS' DESIGN |

FIG. 14B

FOR ON-MODULE TESTING:

| COMPARISON | ARRANGEMENT CONNECTION | SELF – SUFFICIENT | | NEIGHBOR – ASSISTED | |
|---|---|---|---|---|---|
| | | LINEAR | ARRAY | LINEAR | ARRAY |
| USE OF MODULE PINS | | $N_c + 5$ | $m+n+4$ | $N_c + 5$ | $m+n+4$ |
| WIRING ON MODULE | | $N_c(3+\frac{m}{2})$ | $4N_c + \frac{m}{2}$ | $N_c(3+\frac{m}{2}+\overline{N_i})$ | $N_c(4+\overline{N_i}) - (m-n)\overline{N_i}$ |

CHIP AND WAFER CONFIGURATION AND TESTING METHOD FOR LARGE-SCALE-INTEGRATED CIRCUITS

DESCRIPTION

1. Technical Field

In the past, large and complex logic circuits were built up of relatively small and simple units. Manufacturing and diagnostic testing of such smaller units as well as the larger ones were routinely done without much complexity. This was possible because of the prevailing accessibility to the body of the circuitry both for the application of test stimuli and for the probing and examination of circuit responses. Occasionally, some normally interior points were specially brought out to convenient locations explicitly for testing purposes. such design diversions rarely amounted to any substantial problem.

With the advent of large-scale integration (LSI), however, direct accessibility to the body of a group of circuits in any physical unit such as a chip or module becomes greatly limited. This is because of the vastly increased number of circuits included within an LSI unit and also because of the microscopic dimensions these circuits now assume. Testing such circuitry is a major concern in the electronics industry. The problem of testing an LSI unit is further aggravated by the presence of the now inaccessible storage elements or latches which are regularly embedded among the combinatorial logic networks. Without an assured way of setting and examining the logic states of such embedded latches, there can be no testing of the associated logic networks. Yet, a reliable and thorough testing of all LSI units is indispensible in manufacturing as well as in maintenance. Several recent inventions listed in the "Background Art" section provide system design methods and disciplines that answer the above need. They all come under the generic title LSSD (Level Sensitive Scan Design). The common main thrust of these inventions is to prescribe a built-in capability for every LSI unit, such as chip module etc., whereby the entire logic state of the unit, when under test, can be explicitly set and/or examined through exercising certain input/output (I/O) procedures at a limited number of I/O terminals. This requirement is implementible by imparting a shift-register capability to every one of the logic system latches in the unit and thereupon organizing these shift register latches (SRL) into one or more shift register data channels with their terminal stages accessible to the outside world. Details of operations using the SRL facility for various aspects of the testing purposes are given in most of the aforementioned patents. Particular reference may be made to FIG. 8 of U.S. Pat. No. 3,761,695 and FIGS. 7, 8 and 9 of U.S. Pat. No. 3,784,907. Stated very briefly, the LSSD approach comprises a test operation wherein certain desired logic-test patterns are serially inputted and shifted to the appropriate latch locations when the unit is operated in the "shift mode", so to speak, (i.e. by withholding the system clock excitations and turning on the shifting clock to the unit). When this is done, the latch states will provide the desired stimuli for the testing of the related logic nets. Now, propagate the test patterns through the nets by executing one or more steps of the "Function Mode" operation (i.e., by exercising one or more system clock excitations). The response pattern of the logic networks to the applied stimuli is now captured by the system latches, in a known manner depending on certain details of hardware design, often replacing the original inputted test patterns. Then the system reverts to the shift-mode operation, outputting the response patterns for examination and comparison with standard patterns which should be present if the circuitry has operated properly.

The previous description of LSI circuitry testing problems presupposes that the individual LSI chips have been manufactured on larger wafers, subsequently "diced" and individually tested prior to assembly into modules. The present state of the LSI fabrication technology is such that full wafer integration of logic circuits is still unfeasible, mainly due to three reasons, limitation of yield, limitation of field size in high-resolution photolithography and the impracticability of realizing economically a large number ($10^5$–$10^6$) of random-logic circuits as an iterative array. Thus, LSI is still being limited to an area (a chip) much smaller than that of a wafer, and current practice is to batch-fabricate on a wafer a number of chips of the same type by "step-and-repeat" techniques and then cut up the wafer into chips at the end of processing.

As far as the accept/reject testing of individual chips is concerned, basically three approaches are conceivable. The first is to cut the wafer into chips and then functional-test them individually. A second approach is to do a coarse (maybe-good or maybe-no-good) test of the chips before dicing the wafer and then to cut out and functional-test only those chips which have been found to be "maybe-good". The third approach is to functional-test the individual chips in-situ before dicing the wafer.

Obviously, the choice among these approaches depends on many factors. The chip yield, the ease and cost of handling, the cost of test equipment, of the individual tests, of dicing, etc. For instance, the second approach above could be preferable to the first only if the chip yield is low and the cost of introducing the coarse on-wafer test is lower than that of dicing and individually coarse-testing the bad chips. On the other hand, the third approach would be definitely superior to the first and second approaches with respect to the ease and cost of handling, but it imposes certain extreme requirements on the test equipment, making it prohibitively costly and technically infeasible. These requirements and the problems they present involve the following. There is great difficulty in making good and reliable probing contacts onto a large number of pads on the chip. This involves miniaturized-construction and space-limitation problems. It is also difficult to connect the probing contacts to the tester. Many if not all of these connections have to be high-quality, suitable for matched pulse-signal transmission, so as to be usable for functional tests. This aggravates the miniaturized-construction and space limitation problems. Providing for step-and-repeat probing onto the individual chips on the wafer is also a major problem. This involves very high precision mechanical construction of the test equipment and thus high initial and maintenance costs.

All of these problems are further aggravated in the case of chips built in, for example, Josephson technology, since testing must be done with the chips at liquid helium temperatures. Further, the art is continually exploring ways to achieve higher circuit speeds. Consequently, the situation often encountered is that the circuits under development and to be functional-tested are much faster tnan the test equipment available.

The present invention provides a design approach and testing method which circumvents these problems and will allow on-wafer testing of individual chips to be done without necessitating expensive test equipment involving high precision step-and-repeat mechanisms. The method should be applicable to the testing of LSI logic chips fabricated in semiconductor or other circuit technologies (e.g., Josephson). The basic concept is to utilize chip configurations incorporating LSSD circuit design and so organize the wafer that such LSSD circuitry incorporated in the chips can be utilized for on-wafer testing.

There are a number of patents set forth in the "Background Art" section illustrating various examples of chip/wafer structure wherein additional circuitry is utilized on the wafer surrounding the actual chip core for various chip interconnection and/or chip testing purposes. Individual chips on such an array include certain minimal switching circuitry by which row-column addressing of particular chips is possible whereby an individual circuit may be selected by energizing appropriate row and column address lines for applying tests from external circuitry and accessing the results from a particular chip. However, none of the disclosed prior-art structures utilizes chip-contained circuitry to form an on-wafer and/or on-module configuration that actually allows the functional testing of the chips to be done on-wafer or on-module.

Furthermore, with the increasing circuit densities and complexities in the chip, limitation due to the relatively small number of I/O lines available for testing purposes makes the provision for functional testing of the chip more and more difficult.

It is accordingly a primary object of the present invention to provide an arrangement and method which allows exhaustive functional-testing of individual LSI chips to be done on-wafer.

It is another object of the present invention to provide an LSI chip and wafer configuration which, using the LSSD testing circuitry incorporated in the individual chip images and providing the proper inter-chip and I/O connections on the wafer, makes the application of the said testing method possible.

It is a further object of the invention to provide an arrangement and method, with which the circuitry incorporated and utilized for the on-wafer testing can subsequently be utilized also for on-module testing where the chips may remain mounted in their respective subassemblies.

2. Background Art

The following patents are illustrative of the LSSD Testing Arrangements and Organizations and should be referred to for detailed description of their underlying principles. It should be understood that the present invention does not claim any novelty in the use of any particular LSSD architecture but only in the broad architectural concept of utilizing such circuitry together with additional circuitry to facilitate on-wafer testing of LSI chips.

U.S. Pat. No. 3,783,254 entitled "Level Sensitive Logic System", application Ser. No. 297,543, filed Oct. 16, 1972, granted Jan. 1, 1974 to E. B. Eichelberger and of common assignee.

U.S. Pat. No. 3,761,695 entitled "Method of Level Sensitive Testing a Functional Logic System", application Ser. No. 298,087, filed Oct. 16, 1972, granted Sept. 25, 1973 to E. B. Eichelberger and of common assignee.

U.S. Pat. No. 3,784,907 entitled "Method of Propagation Delay Testing a Functional Logic System", application Ser. No. 298,071, filed Oct. 16, 1972, granted Jan. 8, 1974 to E. B. Eichelberger and of common assignee.

The following list of patents is exemplary of prior-art approaches utilizing the deposition of circuitry in the kerf areas between logic chips on the wafer.

U.S. Pat. No. 3,781,683 entitled "Test Circuit Configuration for Integrated Semiconductor Circuits and a Test System Containing Said Configuration", application Ser. No. 129,429, filed Mar. 30, 1971, granted Dec. 25, 1973 to L. E. Freed and of common assignee.

U.S. Pat. No. 3,849,872 entitled "Contacting Integrated Circuit Chip Terminals Through the Wafer Kerf," application Ser. No. 300,075, filed Oct. 24, 1972, granted Nov. 26, 1974 to E. M. Hubacher of common assignee.

U.S. Pat. No. 3,913,072 entitled "Digital Integrated Circuits", application Ser. No. 381,686, filed July 23, 1973, granted Oct. 14, 1975 to I. Catt.

Article entitled "Memory System Fabrication Using Laser Formed Connections", by T. W. Cook and S. E. Schuster, IBM Technical Disclosure Bulletin, Vol. 17, No. 1, June 1974, page 245.

DESCRIPTION OF THE DRAWINGS

FIGS. 2A and 2B illustrate the gating of serial test-data output from chip to chip for on-wafer testing.

FIGS. 3A through 3D illustrate the provision of supplementary latches and gating of serial output and parallel inputs, in the cases of four chip-circuitry structures and two chip-image-extension approaches.

FIGS. 4A through 4C illustrate a "self-sufficient" arrangement of using a chip's latches to store test-data input and output for on-wafer testing.

FIGS. 7A through 7C illustrate the "neighbor-assisted" arrangement of using latches in an adjacent chip to store test-data inputs or test results for on-wafer chip testing, with the cutaway and the deactivate approaches, for circuitry shown in FIGS. 1B, 1C and 1D.

FIGS. 8A through 8C illustrate the "neighbor-assisted" arrangement of using latches in an adjacent chip to store test-data inputs or test results for on-wafer chip testing, with the extend-usage approach, for circuitry shown in FIGS. 1B, 1C and 1D.

FIG. 9 is a summary of the number of "global" inter-chip connections needed on the wafer in the cases of various arrangements and approaches.

FIGS. 12A and 12B illustrate the linear and array method for connecting chips with self-sufficient extend-usage design for on-module testing.

FIGS. 13A and 13B illustrate the linear and array method for connecting chips with neighbor-assisted extend usage design for on-module testing.

FIGS. 14A and 14B provide a general summary of the schemes for the on-wafer and on-module testing of chips respectively.

DISCLOSURE OF INVENTION

Figure 1A:
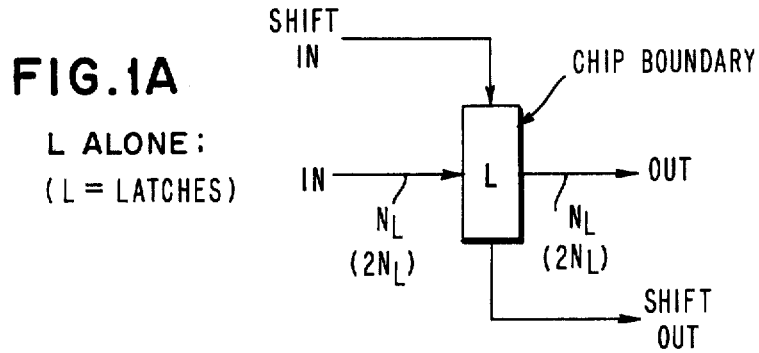
FIGS. 1A through 1G illustrate the various possible circuit structures which may be contained in an LSI Logic chip. The terminology used in these figures is also used in the other drawings and the specification.
Figure 1B:
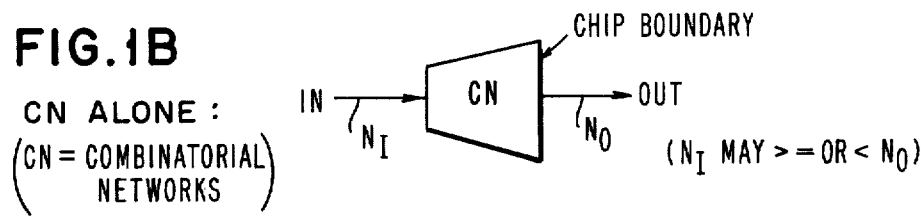
Figure 1C:
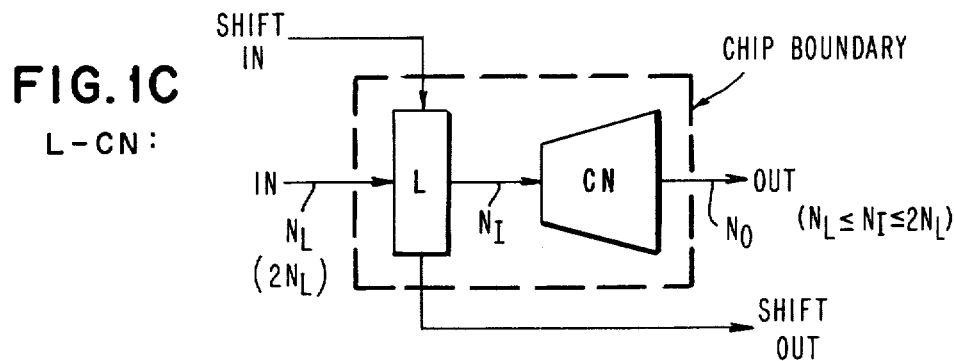
Figure 1D:
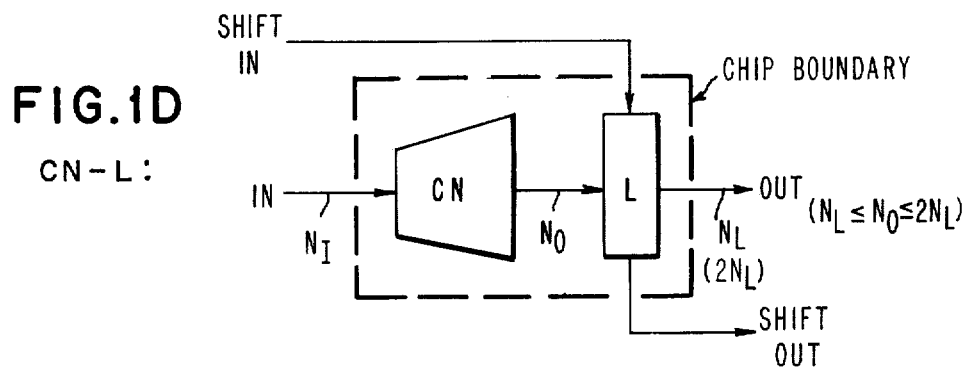
Figure 1E:
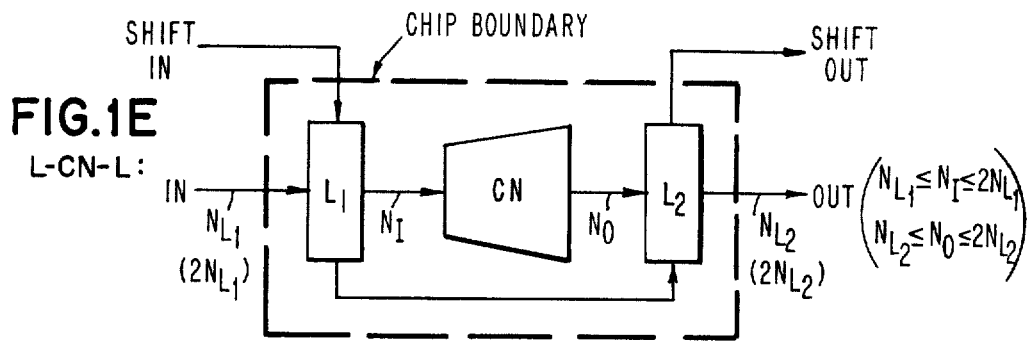
Figure 1F:
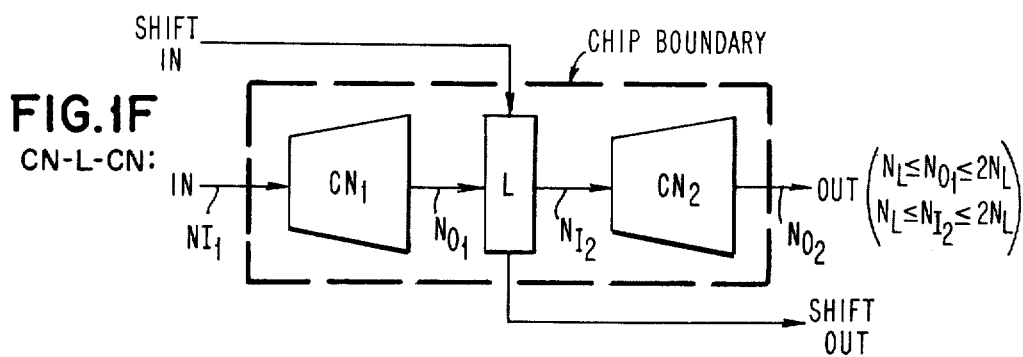
Figure 1G:
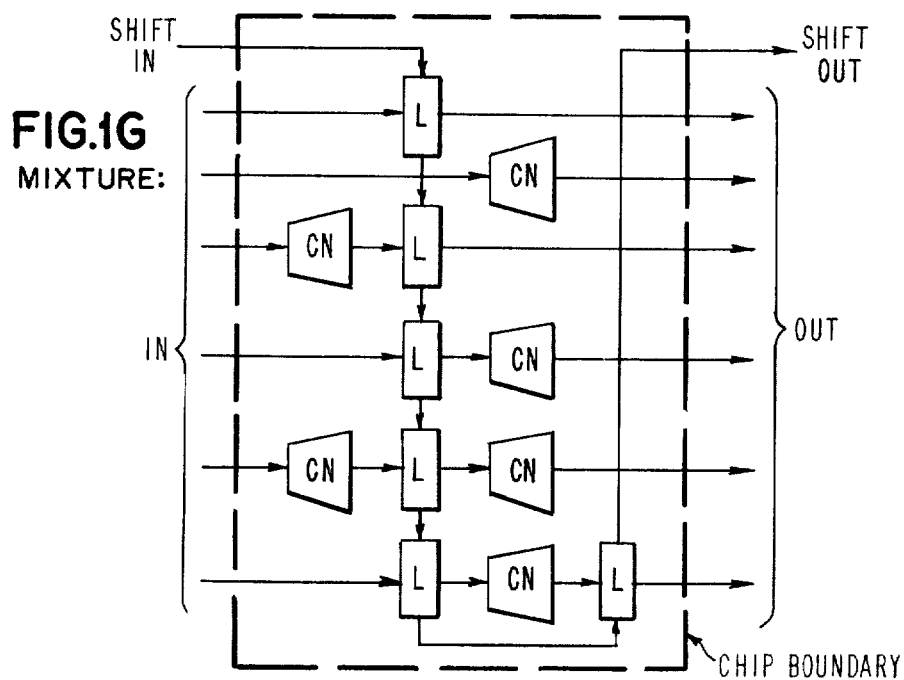

The present invention comprises two closely related concepts: (1) a special chip-design approach to allow on-wafer testing, and (2) a method for using the special chip design for on-wafer testing and subsequently (in the case of the extend-usage approach) also for on-module testing of the chips.

Generally speaking, a logic chip may contain many circuits of different types which in combination, form structures. Depending on whether an information-retaining or an information-processing capability is involved, circuit functions may be divided into two main categories: latches (L) and combinatorial networks (CN). The various circuit structures which may be encountered in a chip are shown in FIG. 1 as cases (a) through (g). These are:

(a) L(=latches) alone,
(b) CN (=combinatorial networks) alone,
(c) L-CN structures,
(d) CN-L structures,
(e) L-CN-L (or L-CN-L-CN- . . . -L) structures,
(f) CN-L-CN (or CN-L-CN-L- . . . -CN) structures, or
(g) a mixture of the above.

In the following description, such circuit structures, when referred to, will be called (a), (b), (c), (d), (e), (f) or (g)—as they are shown in FIG. 1—for simplicity. As mentioned before, the on-wafer chip-testing scheme being described relies on the utilization of LSSD provisions in the chips. Thus the presence of some latches is being presumed. If a chip has no latches in it, then latches will have to be provided in addition. Seen from this respect, case (b) above (with CN alone) will be uneconomical and unfavorable. Similarly, case (f) with CN-L-CN structures will be also unfavorable, because the latches therein are not readily accessible across the chip boundary and therefore are difficult to use for test purposes. Thus, for economy and amenability to the test scheme of the present invention, circuit structures which have latches with either their inputs or outputs accessible across the chip boundary will be preferred. These are the cases (a), (c) through (e), and case (g) provided it is a mixture of cases (a), (c), (d) and (e).

The partitioning of circuitry into chips should be done, therefore, in such a way that each chip type would, if possible, be equipped with some latches either at the input or the output end of the chip. This is desirable mainly for economy and for simplification of test procedures; however, it does not necessarily constitute any prerequisite for using the test scheme.

All latches which are provided on the chip should be so designed that they can be operated also in the LSSD mode. This requires that the latches should, besides their normal functional input and output connections, be linked together in such a way that, when operated in the LSSD mode, they form a shift-register chain so that information can be put into or taken from any or all of them by serial shifting.

Seen from the testing point of view, case (a) with L alone may be considered trivial, since it is already implied by the provision of LSSD; from the on-wafer-testing point of view, however, the generation of L-alone chips must be considered as a wasteful partitioning practice, since it lets the potential usefulness of the latches for on-wafer testing go unexploited. As already mentioned, case (b) is uneconomical, whereas cases (c) and (d) are the preferred structure forms. Case (e) is actually a concatenation of (a) with (c) or (d): it is acceptable as far as on-wafer testing is concerned, but it should not exist too often, otherwise it may be the result of an unfavorable partitioning strategy—since, for a system which basically comprises a large number of L-CN-L-CN- . . . chains, taking out the L-CN-L structure more than once would unavoidably create the case (b) with CN alone, which will be uneconomical. Case (f) is a concatenation of (b) with (c) or (d): it will also bear the unfavorable consequence of (b)'s as being uneconomical, and like (e), it will also be the result of a poor partitioning strategy, since it will unnecessarily cause some chip to be case (a) with L alone, which will be wasteful. Case (g) simply exemplifies that cases (a) through (f), together with their respective advantages or disadvantages, are allowed to coexist mixedly on a chip, which may cause some slight complication in test procedures, but not necessarily an increase in the overall testing time. The above-mentioned points will become self-evident after the following exposition of the chip-testing scheme details.

There will now follow a discussion of extensions in the chip-image design for on-wafer testing. In the following description, the expression "chip-core' will be used to designate the amount of circuitry as allocated to a chip by the partitioning of a system being implemented. The expression "chip proper" will mean the content of a chip after dicing, which then may or may not comprise additional circuits for test purposes. "Chip image" will mean the image being actually used by step-and-repeat photolithography to make an array of chips on the wafer. Obviously, in physical size, the chip image is always at least slightly larger than the chip proper; in functional content, however, the chip image may be larger than or equal to the chip proper. (Thus, the expression "chip image" here includes the normally-called kerf areas). In turn, the chip proper can be larger than or equal to the chip core both in physical size and functional content.

In order to make on-wafer testing of chips possible, the chip image should be expanded to include additional gating circuits and connecting paths among the chips. These additional circuits and paths will be called 'extras' in the following description.

Three alternative approaches are possible:

(A) "Cutaway" approach: The extras will be used for the purpose of on-wafer testing of the chips only. After the testing, the chip-proper will be diced and the extras (preferably to be placed in the kerf areas as much as possible) will be cut off and discarded. Functionally: chip image > chip proper ≧ chip core.

(B) "Deactivate" approach: The extras will be retained in the chip-proper, but will be left unused. The chip image can be so designed that the extras be placed in the inactive areas of the chip proper (e.g., among the pads, if possible). If necessary, some of the connections for the extras can be scraped open to reduce the effects of loading or reflections, etc. In this case, functionally: chip image > chip proper ≧ chip core.

(C) "Extend-usage" approach: The extras will be retained on the chips-proper, and will remain connected and be used for purposes beyond the on-wafer testing of the chips. Here, functionally: chip image = chip proper > chip core. One of the possible uses will be the on-module testing of the chips. This is a unique feature, with a high potential for providing a powerful tool for the diagnosis of a module populated with all its chips soldered in place. This will be described in more detail later.

Closer consideration indicates that, as far as the wafer real-estate utilization is concerned, there is actually little difference among the three approaches: the primary difference will be that, with (A), the diced chip size can be somewhat smaller (this usually, though, would not be an important issue). As will be seen presently, all three approaches will need additional connecting paths and gating circuits, and the approach (C) will need additional I/O pads and gating circuits.

The first important extension in the chip-image design is the incorporation of gating of the serial test-data output from the chips. The present approach differs from the conventional LSSD concept in that, whereas it is assumed there that the latches in a long shift-register chain, which may encompass a large number of chips or modules or even the whole system, are all in working order and therefore can be used for testing. The present scheme must, on the contrary, suppose that probably many of these shift register latches on the wafer may fail. A reasonable test strategy, therefore, is to make the testability of any given one chip be dependent upon the usability of as few other chips as possible. This implies that not all the latches on the wafer, but only those in one or two chips at a time, should be linked together to form the shift-register chain for LSSD test-data input and output purposes. In other words, switching is needed to configure the paths on the wafer in order to output only the test results from the chip being tested.

FIG. 2 shows the basic principle of gating the chips' serial test-data output for on-wafer testing. The shift outputs of the latches on the chips of a row are fed through AND and OR gates, onto a test-data-out cascade line or bus. (For semiconductor chips, the OR's can be DOT-OR's or the AND-OR combinations can be tri-state output arrangements.) Obviously, this test-data output switching will be needed in all the three (cutaway, deactivate, and extend-usage) approaches. As will be seen later, it can be arranged, if the number of wafer-contact pads allows it, that each row of chips has a serial test-data output, so that the on-wafer chip testing can be speeded up by testing multiple chips, one in each row, simultaneously. With the serial test-data outputs from the chps being selectively switchable, there is no need for switching also the serial test-data inputs to the chips. A test pattern can be shifted into all chips at the beginning of a test cycle: only the outputs of the chips under test (e.g., one in each row of chips) will be shifted out to be examined.

The second essential extension in the chip-image design is the provision, if necessary, of supplementary latches on each chip to accomplish the temporary storage of data (serial-input test patterns and test results to be shifted out) for the on-wafer testing.

Figure 5:
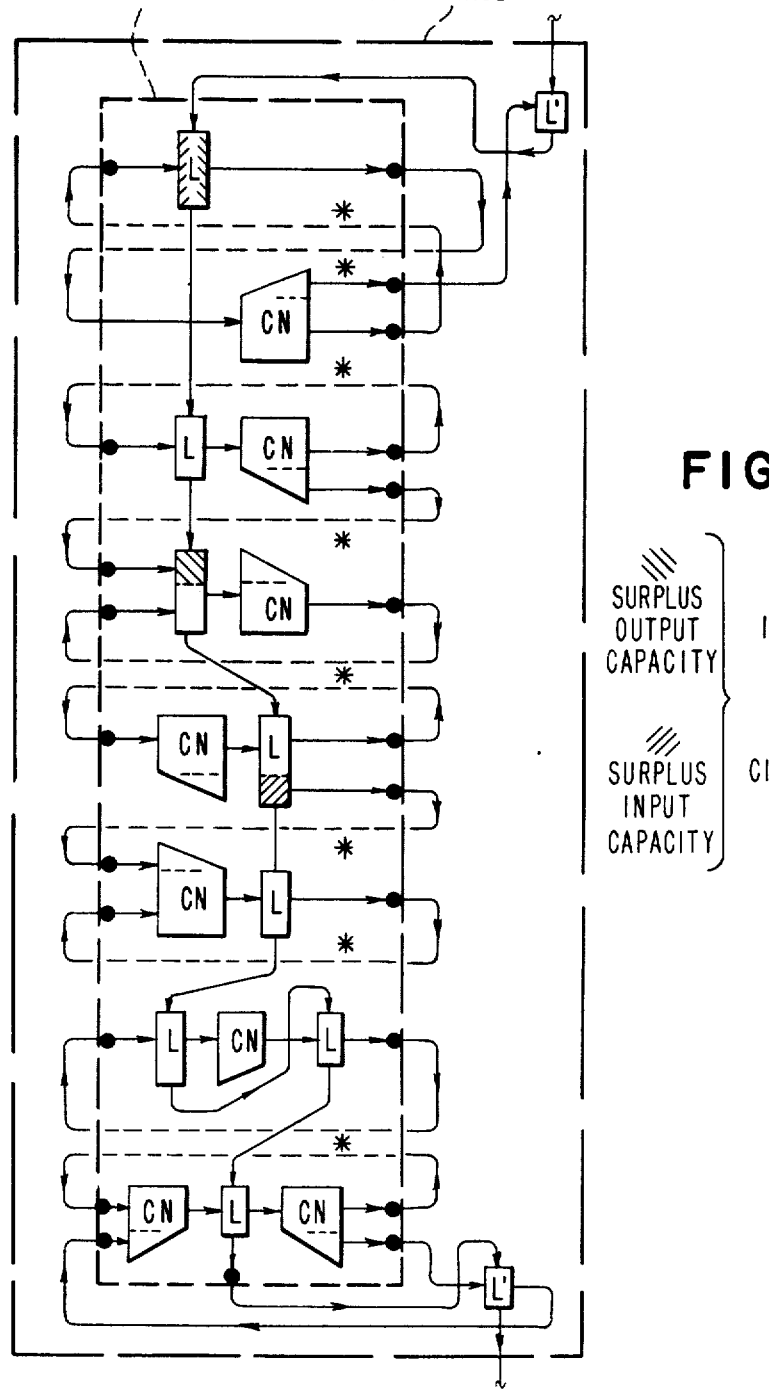
FIG. 5 illustrates a "self-sufficient" arrangement in case of the chip containing a mixture of circuit structures as shown in FIG. 1(g), with cutaway and the deactivate approaches.
Figure 6:
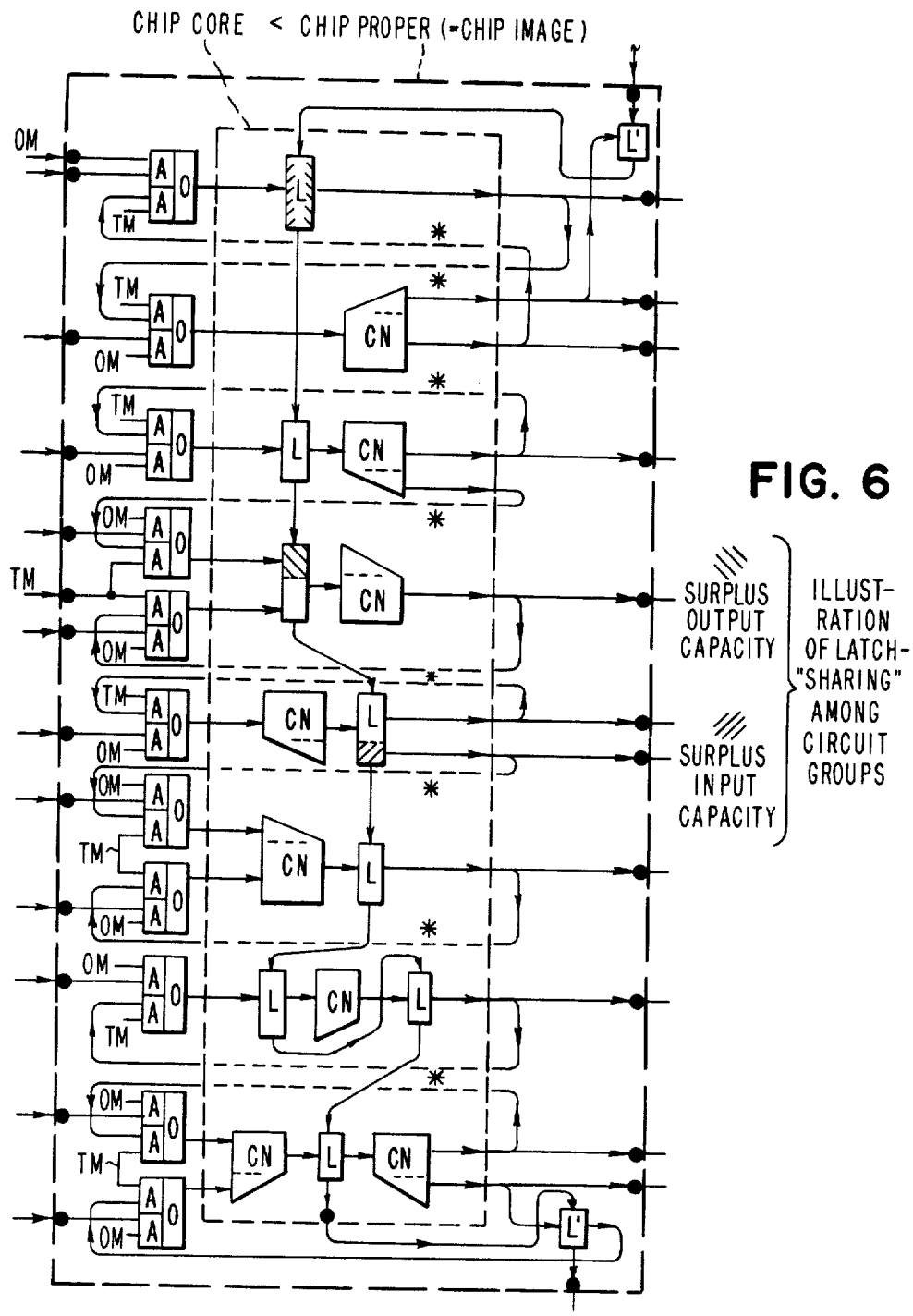
FIG. 6 illustrates a "self-sufficient" arrangement in case of the chip containing a mixture of circuit structures as shown in FIG. 1(g), with the extend-usage approach.

Basically, the functional test of a logic chip comprises a number of steps, each of which consists in feeding the CN (combinational networks) of the chip with a test-sensitive input pattern and then observing the networks' output pattern after a single logic cycle. The input and output patterns have to be stored in latches at the beginning and end of the test cycle. By suitably arranging for the connections, one set of latches on the chip can be used to store either the input or the output, or both (first the input, then the output). Thus, at least one set of latches will be needed. If the combinatorial networks on the chip have $N_i$ input and $N_o$ output bits or lines, then obviously the set must comprise $N_{io}$ latches, where $N_{io} = N_i \lceil N_o = $ the larger one of $N_i$ and $N_o$ ($\lceil$ being the symbol for "ceiling"). If there are $N_L$ latches in the circuits on the chip, and if $N_L < N_{io}$, then $N_L 1 (= N_{io} - N_L)$ latches will have to be furnished additionally in order that the total number of latches provided in the chip will be sufficient for storing, one after the other, the $N_i$ input and $N_o$ output bits. As is shown in FIG. 3, $N_L$, is 0 in the case of (a) with L alone in the chip core; is $N_{io}$ in the case of (b) with CN alone; is 0 if $N_i \geq N_o$, or $(N_o - N_i)$ if $N_i < N_o$, in case of (c) with L-CN; and is 0 if $N_i \leq N_o$, or $(N_i - N_o)$ if $N_1 > N_o$, in the case of (d) with CN-L. This indicates that the structure (a) with L alone is wasteful with respect to on-wafer test, since the L could have been used by some CN, whereas the structure (b) with CN alone, besides being incompatible with the LSSD concept on the chip basis, will be uneconomical for the on-wafer chip-testing scheme because $N_L$, in this case will be largest. This also indicates that, for a system in which the combinatorial networks mostly have more inputs than outputs ($N_i < N_o$), partitioning into L-CN structured chips will be preferable if the on-wafer testing scheme is to be used; on the other hand, if most of the networks have more outputs than inputs ($N_o < N_i$), then partitioning into CN-L structures will be more favorable. As mentioned earlier, cases (e) and (f) can be considered as a concatenation of (a) and (b), respectively, with (c) or (d): the provision of supplementary latches in these cases can be treated accordingly. In the case of (g) with a mixture of different circuit structures, some "sharing" of the latches on the chip is possible, in that, when latches pertaining to a circuit structure have surplus input or output capacities which are not utilized for test within that structure, they can be used as supplementary latches for other structures. This is illustrated in FIGS. 5 and 6.

The third essential extension in the chip-image design is the incorporation of gating of the parallel inputs to the chip core, in order to render the chip operable either in a test mode (TM) or in the normal operation mode (OM). Obviously, this gating will be needed mainly in the extend-usage approach, since in the cutaway and deactivate approaches (where the test mode will be extinct after the chip dicing), irreversible "switching" can be realized by cutting. In the right-hand (extend-usage approach) column in FIG. 3, gating of the parallel inputs to the chip core as needed is shown. It is seen that in the case of (a) with L alone, no gating of the inputs to the L will be needed (an indication that the potential usefulness of L for test purposes is left unexploited); in the case of (c) with L-CN structure, the gating is as the input to L; in the case of (b) with CN alone and of (d) with CN-L, the gating is at the input to CN. Compared to the cutaway and deactivate approaches, the extend-usage approach will need more I/O pads at the chip boundary: $\Delta n_p = (N_{io} + 4x)$, $(N_o + 3x - 1)$ and $(N_i + N_L + 3x - 1)$ in the case of (b), (c) and (d) respectively, with $x = 1$ for parallel and 2 for serial feed. (In the case of "self-sufficient" arrangement to be described below, this $\Delta n_p$ will be reduced to $4x$, $(3x - 1)$ and $(3x - 1)$ respectively.)

Figure 4A:
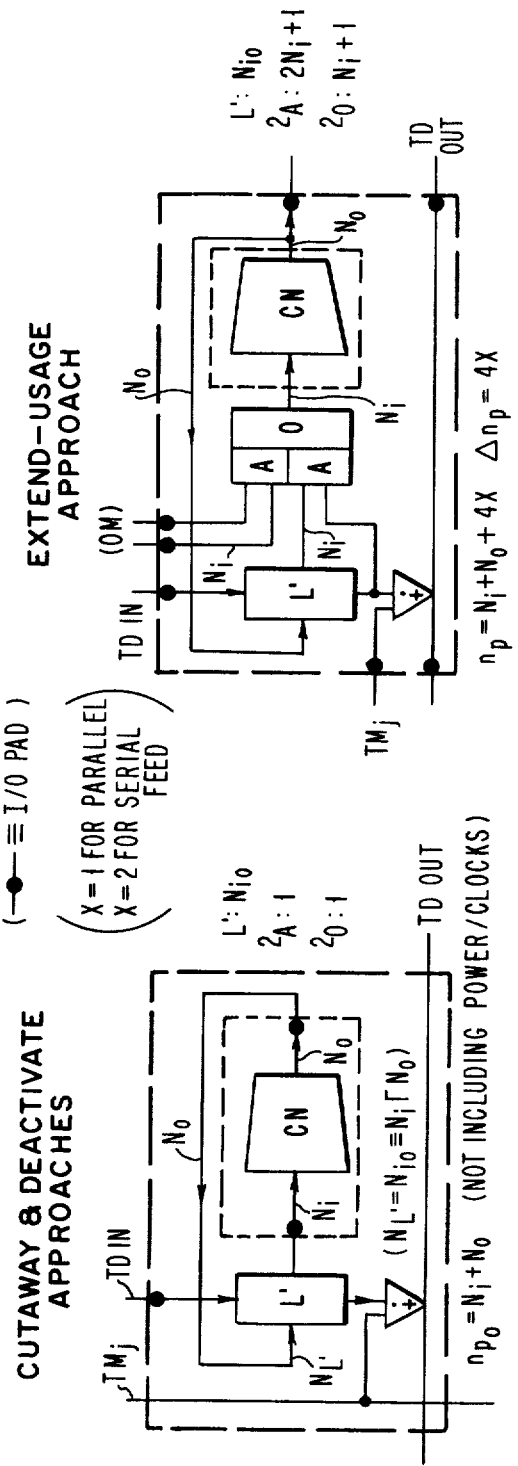

Another essential extension in the chip-image design is the incorporation of in-chip and/or interchip connections to allow the chips to be tested while together on a wafer. This section will describe mainly what connections there should be. How they will be used will be explained later, in the 'Best Mode' section, when the method of testing will be described. Basically there are two arrangements possible. In the first, the latches of a chip will be used to store both its test-data inputs and later also its test results. This will be called the "self-sufficient" arrangement. In the second, the latches of a chip will be used to store either the test-data inputs or the test results, but not both. For the results or the inputs, then, the latches of a neighboring chip will be used in addition. This will be called the "neighbor-assisted" arrangement. As will be seen, both of these arrangements have their advantages and disadvantages. Essentially, the self-sufficient arrangement may be more suitable for the extend-usage approach, whereas the neighbor-assisted could be used for all three approaches. The self-sufficient arrangement consists essentially in connecting the parallel ouputs of each chip back to the test-mode-gated parallel inputs of the same chip. FIGS. 4 to 6 show these connections in the cases (b), (c), (d) and (g) for the cutaway and deactivate approaches and for the extend-usage approach. For the former, the loop-back lines (which, together with the other extras, should preferably be placed as much in areas outside the chip proper as possible) will be cut off or severed; for the latter, these lines will be retained and will be used for post-dicing test purposes.

The self-sufficient arrangement has the advantage of being self-contained, in that it does not rely on the usability of other chips. This means: each chip will be testable by itself. Malfunctioning of latches on one chip will only make that chip untestable and unusable, but will not affect the testability of other chips. Also, with the self-sufficient arrangement, the extend-usage approach will use only a few more I/O pads than the cutaway and deactivate approaches (compare FIG. 4 and FIG. 8).

While the second point above tends to make the extend-usage approach attractive, the self-sufficient arrangement has the drawback that, if $N_o$ in case of (c) or $N_i$ in case of (d) is large, the loop-back connections will require much wiring space. Although this may (except for the real-estate expenditure) be unimportant in the cutaway and deactivate approaches, this can be undesirable in the case of the extend-usage approach due to the possible clogging up of wiring channels and the loading and delay effects of the loop-back lines. The loading and delay effects for the normal operation mode (OM) can be minimized by having the TM-controlled AND-gates placed physically as near to the actual outputs as possible (so that the connections from the output of the TM-controlled AND-gates to the inputs of the OR-gates in FIG. 4 (righthand column) and in FIG. 6 will become the long loop-back lines).

The neighbor-assisted arrangement consists principally in connecting the parallel outputs of each chip to the test-mode-gated parallel inputs of a neighboring chip. However, in order to reduce by half the dependence of a chip's testability upon the usability of the assisting neighbor, it can be arranged that the outputs of each chip be connected to the inputs of not only one, but two of its neighboring chips.

Figure 7A:
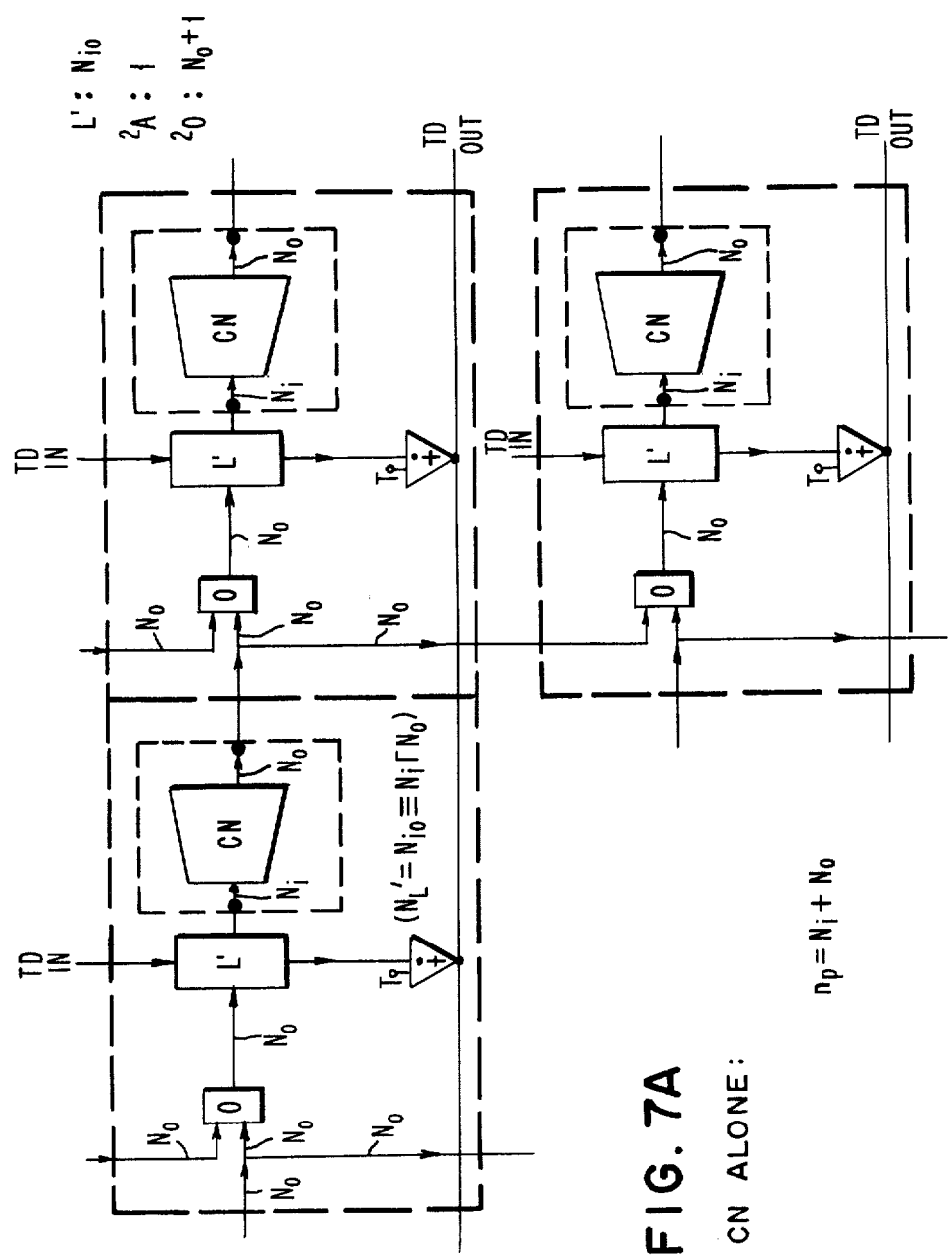
Figure 7B:
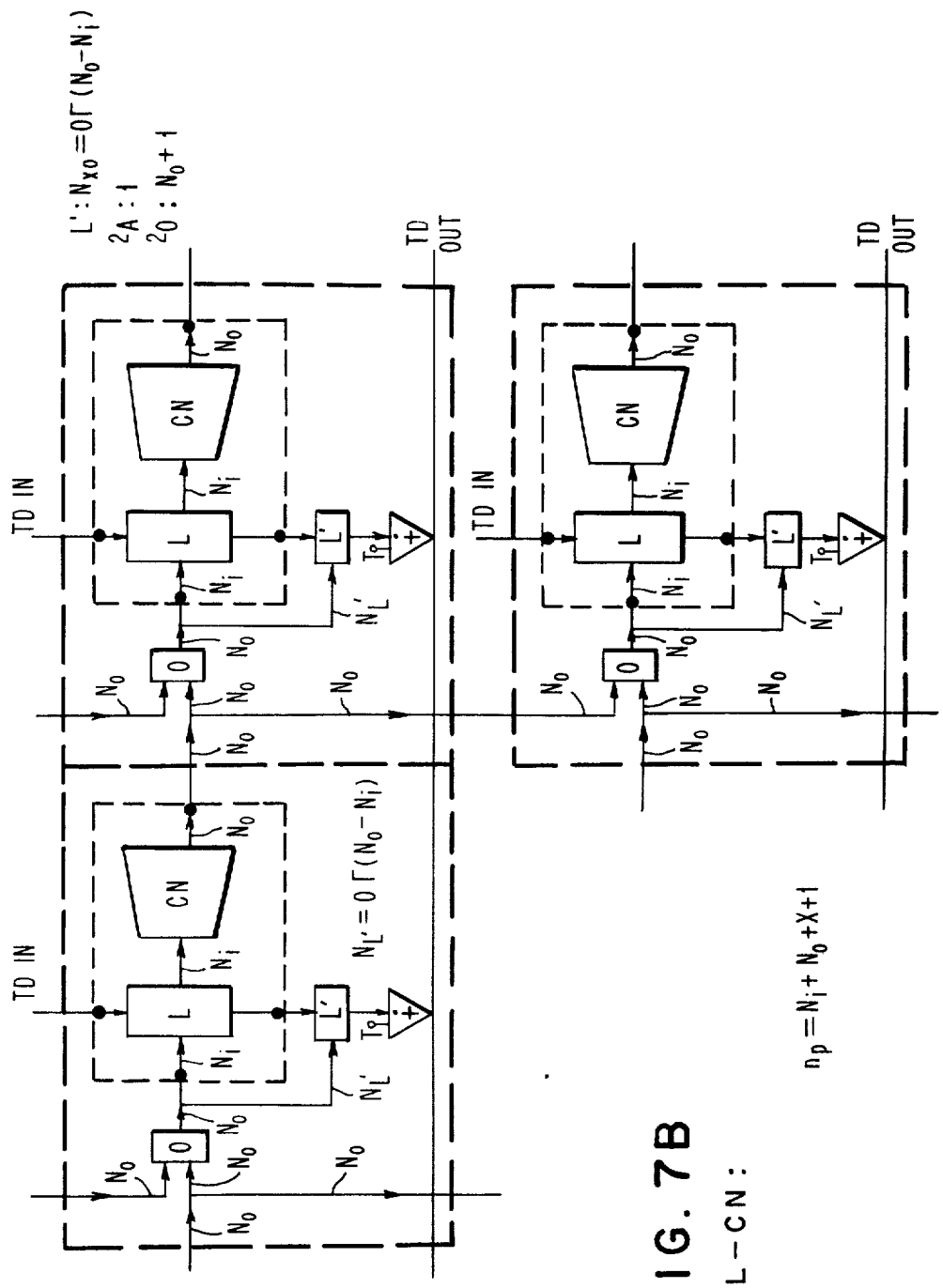

For the cutaway and the deactivate approaches, the outputs of each chip can be fed simply to the inputs of two neighboring chips in parallel, using additional OR-gates to mix two sources at the inputs of each chip. This is shown in FIG. 7 for the cases of (b), (c) and (d). (The cases (a), (e) and (f) seem self-evident; the case (g) will be analogous to FIG. 5.) It is seen that in the cases of (b) and (c)—in (b), since the L' latches are added on the input side of CN—the chips on the right will act as the ones assisting the chips on the left, whereas in (d) the chips on the left (of which only one is shown in FIG. 7(d)) will be the assisting neighbors (i.e., L and L' in the chip on the left will provide the test-data inputs to CN in the chip on the right).

Figure 8C:
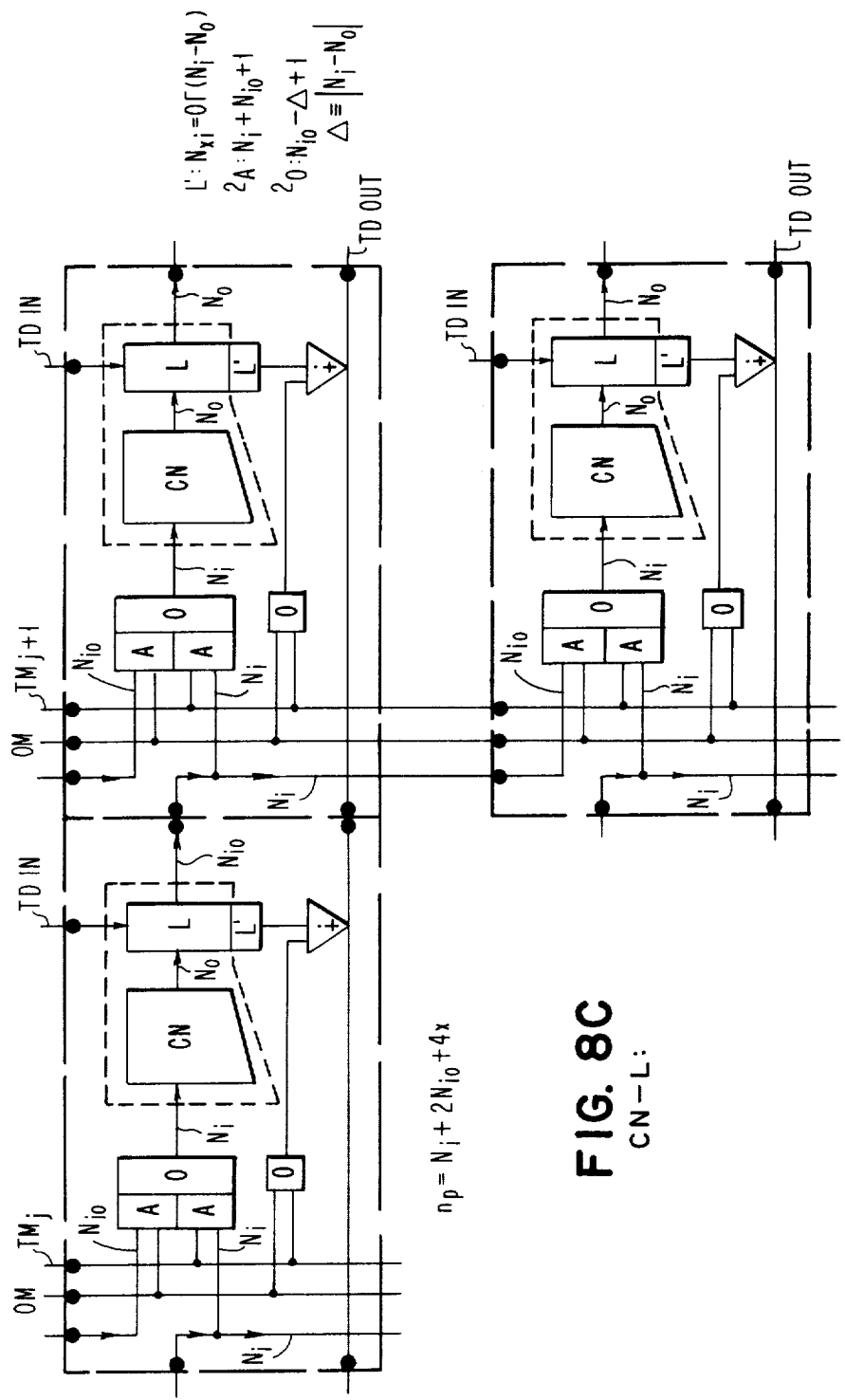

For the extend-usage approach, since, during the on-wafer tests there will be actually no "normal operation mode" yet, the OM-controlled AND gates can be used also for the on-wafer tests in the "neighbor-assisted" arrangement. Thus, for instance, the TM-controlled AND-gates can be used to control data communications between a chip and its assisting neighbor in the same row, whereas the OM-controlled AND-gates can make or break the paths between a chip and its assisting neighbor in a different row. As is seen in FIG. 8, this can be easily arranged for the cases of (c) and (d), but not so easily for the case (b).

So far as described, in all these approaches, the chips in the top and the bottom rows and in the leftmost or-/and the rightmost columns do not have second assisting neighbors. For this, three alternatives are possible:

(1) For these chips, no second assisting neighbors will be provided, leaving these chips at reduced chances for being testable (i.e., they can no longer be tested if any of the latches in the one and only assisting neighbor malfunction).

(2) Wraparound loop-back lines can be provided to allow the top and bottom rows and the leftmost and rightmost columns of chips to act as partners. This, however, will require considerable wiring space, and will forfeit most of the possible advantages of the "neighbor-assisted" over the "self-sufficient" arrangement.

(3) Additional latches can be provided by arranging to use truncated chip images (containing only the latches, their input gates and the serial-output OR-gates and busses) to add an extra row above the top row, one below the bottom row, an extra column to the left of the leftmost column or/and one to the right of the rightmost column. This will not necessitate an extra chip-image design, but will require some additional real-estate expenditure. By utilizing the peripheral areas on the wafer which normally are left unused, the apparent disadvantage of needing additional circuits may be made negligible.

Compared to the self-sufficient, the neighbor-assisted arrangement can have—in the case of the extend-usage approach in combination with the alternative (1) or (3) mentioned above—the essential advantage of not having the many loop-back lines within the chip-proper and therefore of having the loading and delay effects of such connections drastically reduced. The neighbor-assisted arrangement, however, has the disadvantage that, for the extend-usage approach, in order to make the post-dicing on-module testing of the chip possible, the number of latches to be provided on the chip—including additional ones (L') if necessary, as discussed earlier (with respect to FIGS. 5 and 6)—will also depend on the $N_i$ or $N_o$ of the chip it will assist or be assisted by in the on-module testing environment. This will require more correlation between the design of the various chips and of the module, and may necessitate in certain cases more additional latches.

BEST MODE FOR CARRYING OUT THE INVENTION

Chip-Layout Design for Step-and-Repeat Juxtaposition

The foregoing sections described the main additional provisions in the chip-image design needed to make the on-wafer testing of chips possible. These provisions have to be designed and arranged in such a way that, when the photolithographic step-and-repeat reproductions of the chip image are placed in contiguous juxtaposition (or preferably even with some overlapping to ensure continuity of conduction lines) to one another on the wafer, all the chips will become so connected as to be individually selectable and testable. Hence, the layout for the chip image must also take proper account of the interchip connections and the selection and timing controls needed for the on-wafer testing.

As far as their actual physical shapes are concerned, there can be three kinds of interchip connections across the chip-proper boundary: those prepared to leave 2 pads (one on each side of the boundary, for soldering later on) after the dicing, those to leave only 1 pad (on one side of the boundary), and those to leave no pads. These are shown with the symbols

respectively in FIGS. 7 and 8. It is seen that the 2-pad connections will be used exclusively in the extend-usage approach (FIG. 8), the no-pad ones only in the cutaway and deactivate approaches (FIG. 7), whereas the 1-pad ones can be used in all approaches. As will be discussed later, in the neighbor-assisted arrangement with the cutaway or the deactivate approach (FIG. 7), in order to allow AND gates to be saved at the parallel inputs to the chips, the powering of chips of a column will be divided into 2 groups (chips in odd-numbered or in even-numbered rows) to be used as a selection control, whereas the OR gates for the serial-output cascade lines (if these are not implemented as Dot-ORs) will remain continually powered. The chip-image layout design should also take this into consideration.

In addition to all these, the chip-image layout should be so designed, if possible, that those chip-I/O pads which have connection to probe-contact pads on the wafer will be placed along the chip periphery in such a way that their distribution will be symmetrical with respect to 90°-rotations (or at least to a 180°-rotation), so as to facilitate the connection of the chip-image array to the probe-contact pads.

Wafer Organization and On-Wafer Chip-Testing Procedure

To allow on-wafer testing, the chips should be arranged and connected together on the wafer so that the following conditions exist.

(1) By step-and-repeat photolithography, reproductions of the chip image are placed in contiguous juxtaposition (or with small overlapping) on the wafer to form an array of chps with M rows and N columns.

(2) All chips will receive the test-data serial input in common. In order to reduce loading and delay effects and to avoid the need for including fanout stages in the chip image, multiple feeds can be provided for the input. Assuming that a row of N chips can share a feed without causing excessive loading or delay, then there will be approximately M lines for distributing this test-data input on the wafer.

(3) The N chips of each row will have a serial-output cascade line in common. Thus there will be M serial-output cascade lines (busses) on the wafer, in that potentially up to M chips can be tested simultaneously.

(4) For the self-sufficient arrangement with the cutaway or deactivate approach (FIG. 4 left):

(a) Except for the test-data serial input and serial-output cascade lines mentioned above, the chips have no other connections with one another.

(b) The chips of each column will receive a separate test-mode (TM) control in common. Thus there will be N TM-lines on the wafer.

(c) All chips can receive a common power supply (which can be the same as that for the serial-output-cascade OR's) and can be powered continually. However, if sufficient wafer-contact pads are available, it may be desirable to use multiple lines for the power supply also, in order to avoid high probe currents or to reduce heat dissipation by shutting off the chips not being tested.

(5) For the self-sufficient arrangement with the extend-usage approach (FIG. 4 right):

(a) The chips of each column will receive a test-mode (TM) control in common. The operation-mode (OM) pad and the pads for $N_i$ inputs to AND-gates controlled by OM on each chip have no connection outside the chip-proper boundary. Thus, there will be N TM-lines and no OM-lines on the wafer.

(b) Same as (4c) above.

(6) For the neighbor-assisted arrangement with the cutaway or deactivate approach (FIG. 7):

(a) The parallel outputs of each chip will be connected to the parallel inputs of two nearest chips on its right, one in the same row and one in the next row below. Chips in the first and last ($M^{th}$) rows will have similar connections with a row of truncated chip-images above it and below it, respectively. Chips in the first and last ($N^{th}$) column will have similar connections with a column of truncated chip images to its left and to its right, respectively. Thus, there will be (M+1) lines to feed the test-data serial input, and (M+1) lines for the test-data serial outputs.

(b) The power supply for the chips of each column will be divided into two parts: one for chips belonging to odd numbered rows, the other for chips in even-numbered rows. Thus, there will be 2(N+1) selectable power-supply lines, and 1 continual power-supply line for the serial-output-cascade OR's, on the wafer. The 2(N+1) selectable power-supply lines will also serve as the controls (instead of TM) for the gating of serial test-data outputs in the chips fed by these lines.

(7) For the neighbor-assisted arrangement with the extend-usage approach (FIG. 8):

(a) Same as (6a) above.

(b) Same as (4c) above.

(c) The chips of each column will receive a test-mode (TM) and an operation-mode (OM) control in common. Thus, there will be (N+1) TM-lines and (N+1) OM-lines on the wafer (the extra one line in both cases being for an added column of truncated chip-images.)

FIG. 9 gives a summary of the "global" interchip connections (i.e., those linking more chips than only 2 adjacent ones) in the various cases of arrangement and approach combinations. The numbers appearing on the bottom line in FIG. 9 represent also the minimum total number of signal/control lines needed to allow the on-wafer testing of chips (as designed for the given arrangement and approach combinations) to be performed. These are therefore also the minimum numbers of wafer-contact pads needed for the testing scheme. These numbers range between (2M+N+1) and (2M+2N+5), where M is the number of chip rows and N that of chip columns.

Figure 10:
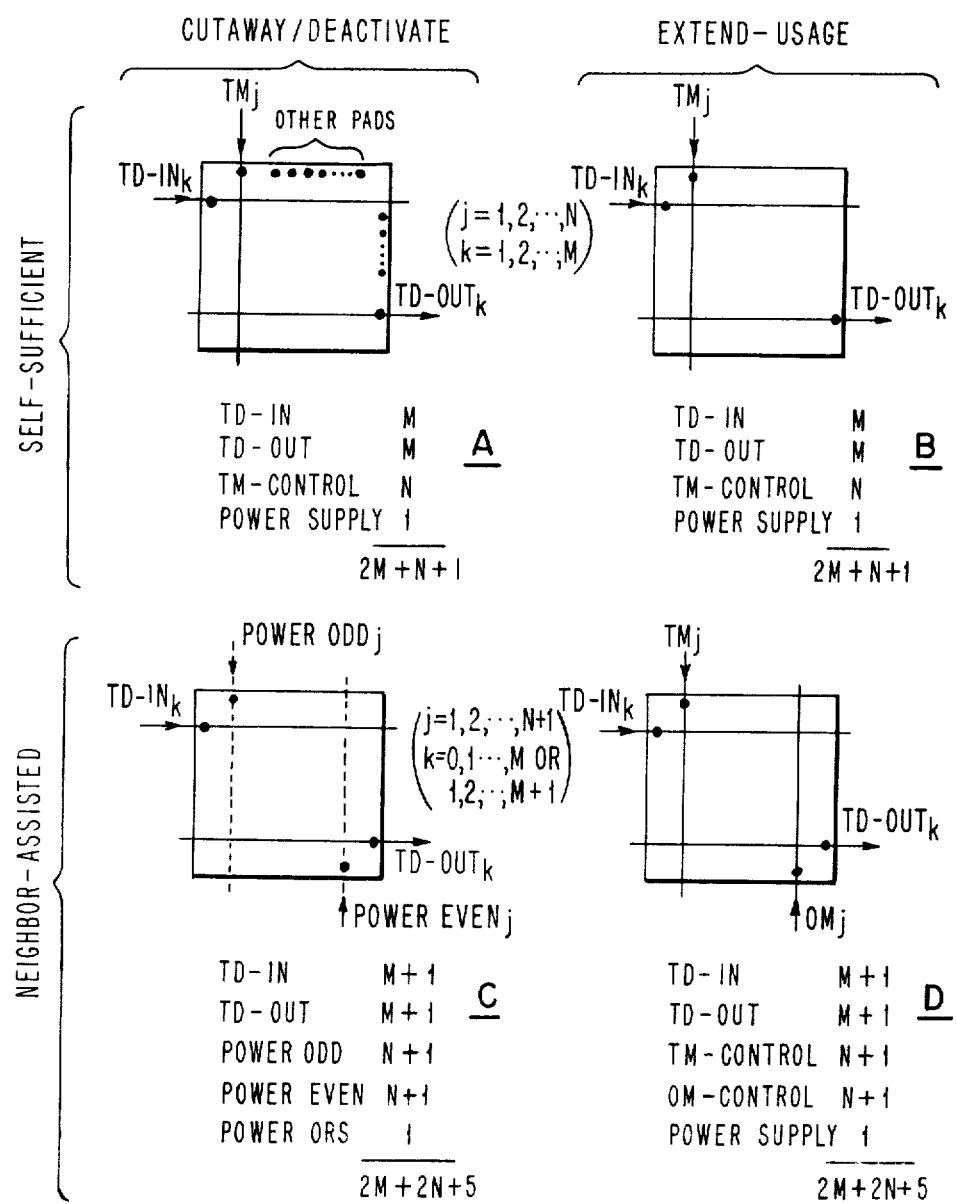
FIGS. 10A through 10D comprise schematic diagrams showing the "global" connections traversing a chip in the four illustrated arrangements and approaches.
Figure 11A:
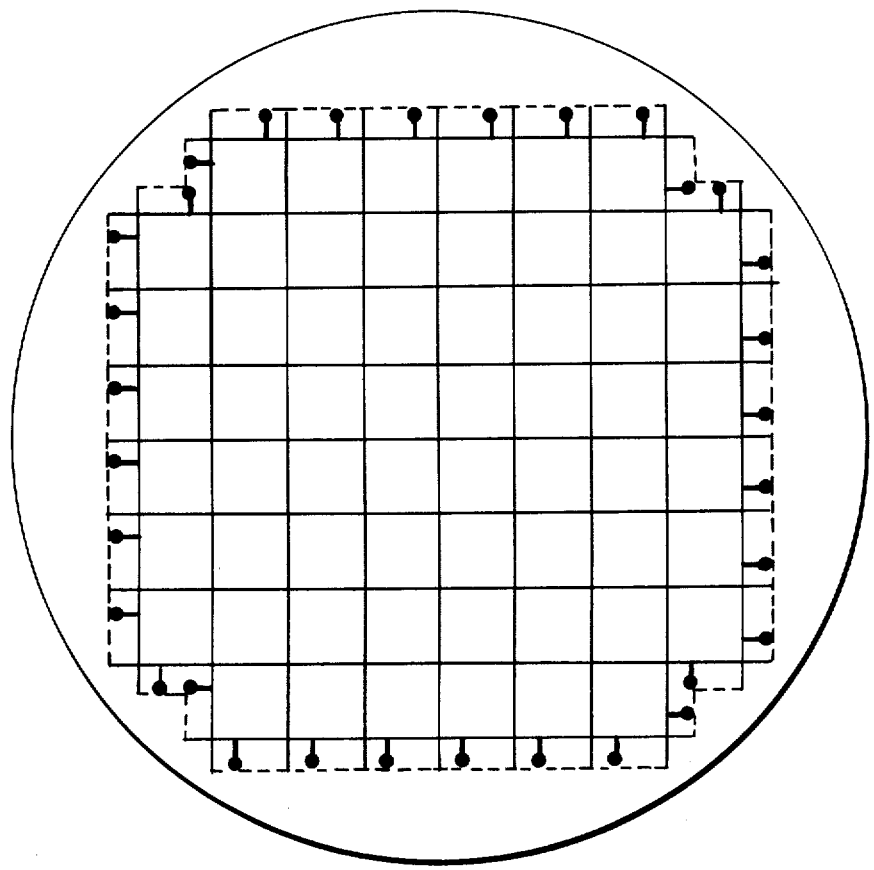
FIGS. 11A and 11B illustrate the connection of a chip-image array to the contact pads on a wafer.
Figure 11B:
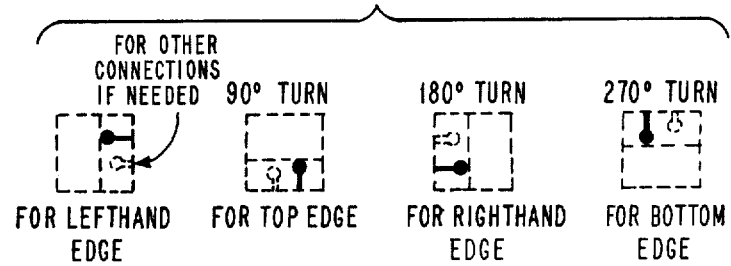

At the present state of the art, with the chips being about (200 mil)$^2$ to (250 mil)$^2$ and the wafer being 1" to 3.25 in diameter, M and N are usually <10, and in any case <16. Thus, for the on-wafer chip-testing scheme being proposed, the number of probe-contact pads needed to be provided will be about 20 for a 1" $\phi$ wafer, 35 for a 2.25" $\phi$ wafer, or 50 for a 3.25" $\phi$ wafer, which should be easily realizable in a wafer-sample holder using the existing constructional techniques. In general, it is seen that the main terms in giving the number of wafer pads are 2M+N in the case of the self-sufficient arrangement, or 2(M+1)+2(N+1) in the case of the neighbor-assisted. Thus, it will be expedient to feed the TD-IN's and TD-OUT's in the chip-row direction and the TM and OM controls or the odd/even-group power supplies in the chip-column direction (FIG. 10), and to arrange the wafer pads accordingly (FIG. 11a). By having the chip-image layout designed in such a way that, of the chip I/O pads, those (only 3 or 4 per chip) which are to be connected to the wafer pads for the chip-testing scheme are placed in positions which will be identical after a 90°-rotation (or at least a 180°-rotation) of the image, the connection of the chip array to the wafer pads later on can be considerably simplified. A "wafer-pad-and-connection" image (FIG. 11b), which comprises one or two pads (preferably 25 to 30 mil □ (or squared)) and their connections to certain channel positions, can be used similarly by step-and-step in a juxtaposed or slightly overlapping way—to generate the probe-contact pads and their connections to the chip-image array on the wafer.

The on-wafer chip-testing procedure will consist mainly of two parts. These are as follows:

(1) Test of Latches for Serial Input and Output

A test-data pattern (e.g., alternately 0-and-1's) will be shifted into the latches and then without their being altered to receive any CN results, their contents will be shifted out again and compared with the original pattern. This will test the latches as registers and shift chain, and the serial-output-cascade OR-gates as data paths.

(2) Test of Combinatorial Networks

The proper functioning of the CN's will be tested by means of a sequence of Selected-Pattern-Test (SPT) steps. Each step will consist of:

(a) A selected pattern (SP) will be shifted into the latches which are to feed the input to the CN in the chips to be tested.

(b) A logic cycle will be allowed to run through: The SP contained in the latches will be inputted to the CN in the chips under test; at the end of the cycle the CN's outputs will be stored in latches.

(c) The contents of the latches will be shifted out, to be compared with their should-be pattern.

The selected patterns (SP's) and the sequence of using them can be designed systematically so as to optimize the probability of detecting the presence of defects in the CN being tested and thus to minimize the number of cycles needed for the detection. As soon as a chip is found to be defective, it will be considered as a reject and can be skipped from any further testing. On the other hand, however, since in the scheme M chips of a column can be tested simultaneously (thus giving a higher test throughput), the skipping will mean, in the case of individual defective chips, only the omitting of the output comparison by the diagnostic computer for these chips (which will increase the speed of testing if it is being computer-limited). Of course, when all chips of a column have been found defective, the further testing of that column can be immediately skipped.

The sequence of selected-pattern-test (SPT) steps can be as long and exhaustive as desired. Thus, theoretically, a complete "functional" testing of the logic chips can be done entirely on-wafer using the proposed scheme. It is only a matter of tradeoff between the costs of testing and its coverage. It may be noted, however, that testing by the proposed scheme will—to any same degree of exhaustiveness—be considerably more economical than the testing of individual diced chips because of easier handling and the simultaneous testing of all the chips in a column on the wafer. Moreover, the shifting out of the test results through the serial output can be done at a lower speed if necessary, so that the wafer-pad-contact connections need not have the same high-speed high-frequency characteristics as the circuitry on the chips being tested.

The following discussion sets forth some details of using the various approach-and-arrangement combinations as described previously for the on-wafer testing of chips. As can be seen from the top half of FIG. 10, the TM controls for selecting the chip column for testing are basically the same in the cutaway/deactivate and the extend-usage approaches. The following procedures for chip testing are common therefore to all approaches with the self-sufficient arrangement.

(a) First, a TD-IN pattern will be shifted into L in all chips. A TM$_j$ control (j=1,2,... N) will be selected and the contents of L in the chips of the selected column will be shifted out through TD-OUT$_k$'s (k=1,2,..., M) to be compared with the original TD-IN pattern. A disagreement will indicate defect.

(b) Next, a selected pattern for testing CN will be shifted into L in all chips. A logic cycle will be run through, with the CN outputs stored again in L. A TM$_j$ control will be selected and the contents of L in the chips of a selected column will be shifted out through TD-OUT$_k$'s to be compared with a should-be pattern. A disagreement will indicate defect.

(c) (b) is iterated for as many other selected patterns as desired.

(d) (a) through (c) are iterated for all j values (1 through N). Chips with detected defects will be rejected.

As mentioned earlier, for neighbor-assisted arrangements, additional latches and gates using truncated images are to be provided around the array on the wafer. The added rows will be designated the 0$^{th}$ and (M+1)$^{th}$, the added columns the 0th and (N+1)$^{th}$. The test procedure with neighbor-assisted arrangements will be:

(A) Cutaway/Deactivate approaches (FIG. 7 and FIG. 10 lower left):

The neighbor-assisted arrangement-and-cutaway/-deactivate-approach combination uses the power-supply lines to aid the 1-out-of-2-neighbors selection.

(a) First, a single power-supply-even for column j (PSE$_j$), with j=0,1,2,... N+1, will be powered and a TD-IN pattern will be shifted into L of the chips in the selected column and selected even-numbered rows. The contents of these L will be immediately shifted out through TD-OUT$_{ke}$'s with ke=0,2, . . . ,M (assuming M=even) to be compared with the original pattern. A disagreement will indicate defect. This will be iterated for all j values 0 through N+1.

(b) Next, a single power-supply-odd for column j (PSO$_j$), with j=0,1,2,N+1, will be powered and a TD-IN pattern will be shifted into L of the chips in the selected column and selected odd-numbered rows. The contents of these L will be shifted out through TD-OUT$_{ko}$'s with ko=1,3,5, . . . ,M+1, to be compared with the original pattern. This will also be iterated for all j values 0 through N+1.

(c) To test CN, a PSE$_j$ will be powered and a selected pattern for testing CN will be shifted into L of the chips selected. Then, depending on whether the chips in the even or odd rows of column (j+1) are found by (a) or (b) above to be in order and therefore usable as assisting chips, a PSE$_{j+1}$ or PSO$_{j+1}$ will be powered also, and a logic cycle will be run through with the CN outputs stored in L of the selected chips in column (j+1). Then PSE$_j$ will cease to be powered, and with PSE$_{j+1}$ or PSO$_{j+1}$ continuing to be powered, the contents of L in the selected chips in column (j+1) will be shifted out through TD-OUT$_{ke}$'s or TD-OUT$_{ko}$'s, to be compared with a should-be pattern. This is the testing of half of the chips in a column with the assistance of half of the chips in the neighboring column. This is to be iterated using as many selected patterns as desired and for all j values 0 through N−1 (in the case of CN-L structures) or 1 through N (in the case of L-CN structures).

(d) (c) is to be repeated with PSO$_j$ instead of PSE$_j$.

(e) Chips with defects detected in (a) through (d) are to be rejected. It may be noted that, in this arrangement-and-approach combination, the economy achievable by omitting AND gates at the chip inputs is actually obtained at the expense of reducing the test throughput by half.

(B) Extend-usage approach (FIG. 8 and FIG. 10 lower right): This neighbor-assisted arrangement-and-extend-usage-approach combination uses the TM and OM controls to obtain the 1-out-of-2-neighbors selection.

(a) First, A TD-IN pattern will be shifted into L of all chips. Then, a TM$_j$ (or OM$_j$) will be selected to activate the serial-out gating in the chips of the selected column, and the contents of L will be shifted out again through TD-OUT$_k$'s (with k=1,2, . . . ,M in case of TM selection, or k=2,3, . . . ,M+1 in case of OM selection), to be compared with the original pattern.

(b) To test CN, a selected pattern will be shifted into L of all chips. A logic cycle will be run through, with the CN outputs stored into L of all chips at the end of the cycle. A TM$_j$ (or OM$_j$) will then be selected and the contents of L in the selected column will be shifted out through TD-OUT$_k$'s (with k=1,2, . . . ,M in case of TM selection or k=2,3, . . . M+1 in case of OM selection), to be compared with a should-be pattern. This is to be iterated with as many selected patterns as desired and for all j values 1 through N (in the case of CN-L structures) or 2 through N+1 (in the case of L-CN structures).

(c) Chips with defects detected in (a) or (b) are to be rejected.

It may be noted that this arrangement-and-approach combination has the capability of getting M chips tested simultaneously.

On-Module Chip Testing

As mentioned previously in this specification, the extend-usage approach will allow logic chips to be tested also in the connected-on-module environment, which can be a powerful tool for the testing and debugging of modules populated with their chips soldered in place. This section will describe the arrangement and method for making such tests.

In order to make possible the testing of individual chips after they are mounted and connected onto the module, the chips (which now may normally be each of a different type) must all be designed with the extend-usage approach described in the foregoing sections, and the module must be provided with appropriate connections and controls for the testing. These are the following.

While the parallel to-be-OM-gated inputs to the chips and the parallel outputs of the chips should be connected with one another and with the module I/O pins as required for the normal operation, those parts of the circuitry on the chips which are intended to be used for test purposes should be so arranged and joined as to be usable for the tests. Depending upon the positioning of the chips on the module and upon the availability of remainder wiring channels and module I/O pins after the normal-operation connections have been laid out, the chips can—as far as only the test circuitry and paths are concerned—be linked together either in the form of a linear chain or ring, or in that of a two-dimensional (M rows×N columns) array. It will be seen that, while the linear configuration may seem simpler and more straightforward, the array way of connection can actually involve the use of less wiring and module I/O pins.

FIG. 12 shows both the linear and the array methods for connecting chips, which have been designed with the self-sufficient arrangement, for their on-module testing. All the chips on the module can receive the operation-mode (OM) control and the test-data serial input (TD-IN) in common. The test-data serial outputs of the chips are linked together to form either a single test-data output-cascade line (TD-OUT) in the linear configuration, or a number of such lines in the array configuration. Accordingly, the test-mode (TM) controls of the chips are fed either singly or in groups (where no two chips in a group may share an output-cascade line).

Figure 13A:
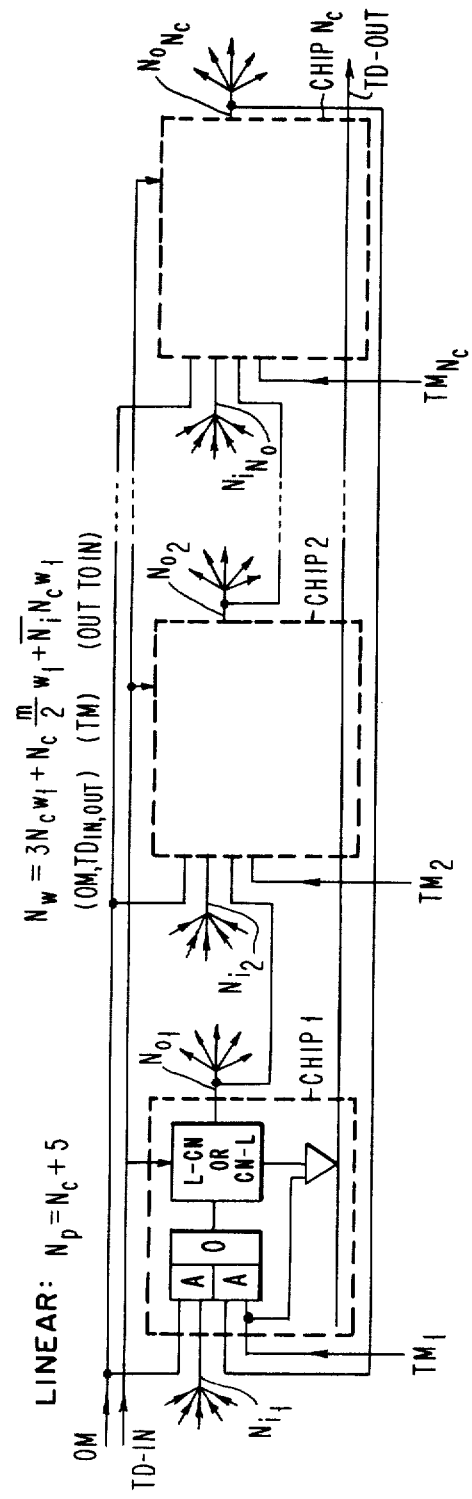

FIG. 13 shows the linear and the array ways of connecting chips, which have been designed with the neighbor-assisted arrangement, for their on-module testing. The main difference from FIG. 12 is that here the parallel outputs of each chip are to be connected to the parallel to-be-TM-gated inputs of another chip, thus linking the chips into either a single ring in the linear configuration, or a number of rings in the array configuration (where no two chips pertaining to a ring may share a TM control). The use of the neighbor-assisted arrangement requires that the number of the parallel to-be-TM-gated inputs of each "follower" chip in the ring should be equal to or larger than the number of the parallel outputs of its "forerunner" chip. This will necessitate some proper coordination between the design of the various chips and the module.

As also shown in FIGS. 12 and 13, assuming there are N$_c$ chips on the module, the array way of connection will give a slight advantage over the linear way by using (m+n+2) instead of (N$_c$+3) module pins, where m is the number of output-cascade lines formed, n the number of TM-control groups, and mn≧N$_c$. Moreover, the array way will involve, in the case of the self-sufficient and the neighbor-assisted arrangements respectively, about $m[(N_c-1)/2-n]$ and $[m((N_c/2)-n)+\overline{N}_i(m-n)]$ fewer units of wiring, with a unit of wiring ($w_1$) being the effective center-to-center distance between adjacent chips and $N_i$ being the average number of inputs to a chip on the module. Taking $N_c=9$ or 16 with $m=n=3$ or 4 as example, the savings in pins would be 8 vs 12, or 10 vs 19, respectively; the savings in wiring would be 6 or 16 units for the self-sufficient arrangement, and (assuming $\overline{N}_i=15$) 124 or 241 units for the neighbor-assisted.

With the on-module interchip connections prepared as described in the foregoing section, the normal operation of the chips will be selected by having the common OM-control activated. The testing of individual chips on module will be carried out by deactivating the common OM-control and selectively activating one or two of the TM-controls at a time.

In the case of the self-sufficient-arrangement chips, the on-module chip testing will be similar to the procedure described previously (for the on-wafer testing with the self-sufficient arrangement).

(a) First, a TD-IN pattern will be shifted into L in all chips on the module. A $TM_j$ control ($j1,2,\ldots,N_c$ in case of linear connection, or $j=1,2,\ldots,n$ in case of array connection) will be selected, and the contents of L in the chip or in the m chips to be tested will be shifted out (through the single TD-OUT in case of linear, or through m TD-OUT's in case of array), to be compared with the original TD-IN pattern so as to ascertain the proper functioning of L as shift registers.

(b) Next, a selected pattern for testing CN will be shifted into L in all chips. A logic cycle will be run through, with the CN outputs stored again In L of all chips at the end of the cycle. A $TM_j$ control will be selected and the contents of L in the chip or in the m chips being tested will be shifted out to be compared with the respective should-be patterns. This can be iterated for as many other selected patterns as desired.

In the case of neighbor-assisted-arrangement chips, the on-module chip testing will be similar to the procedure described previously (for the on-wafer testing with the neighbor-assisted arrangement), with the difference that here there is only one assisting neighbor for each chip being tested and only the TM-controls will be used for the test-chip selection.

(a) Same as procedure (a) in the description referred to above.

(b) Next, a selected pattern for testing CN will be shifted into L in all chips on the module. A logic cycle will be run through, with the CN outputs stored again into L of all chips at the end of the cycle. A $TM_j$ will then be selected and the contents of L in the chip or in the m chips being tested will be shifted out to be compared with the respective should-be patterns. For chips with CN-L structures, $j=1,2,\ldots,N_c$ for testing chip 1 through chip $N_c$ in the case of linear connection; or $j=1,2,\ldots n$ for testing the 1st, 2nd, $\ldots$, nth "column" in the rings of chips in the case of array connection. For chips with L-CN structures, $j=2,3,\ldots,N_c,1$ for testing chip 1 through chip $N_c$ in case of linear connection; or $j=2,3,\ldots,n,1$ for testing the 1st, 2nd, $\ldots$, nth "column" in the case of array. This can be iterated for as many other selected patterns as desired.

Industrial Applications

By utilizing the chip-testing scheme set forth above, extensive functional testing of individual chips on wafer becomes economically feasible without necessitating expensive test equipment involving high-precision step-and-repeat mechanisms. The described on-wafer testing should be cheaper than the testing of individual diced chips because of easier handling and simultaneous testing of multiple chips. Moreover, the connections between the wafer and the external test equipment can be through a moderate number of simple pad contacts and cables, which are not required to have the same high-speed high-frequency characteristics as the circuitry on the chips being tested.

The testing scheme can handle chips with all kinds of circuit structures, although of these the L-CN and CN-L structures are preferred from the point of view of economy and testing efficiency. The scheme involves five major extension in the chip-image design: (1) incorporation of gating of serial test-data output from chips, (2) provision, if necessary, of supplementary latches on chips, (3) incorporation of gating of parallel inputs to the chip core, (4) incorporation of inchip and/or interchip connections, and (5) chip-layout design for step-and-repeat juxtaposition. The basic organization of chips on wafer, the connection of chip-image array to wafer-contact pads, the principle of on-wafer chip-testing procedure, and the use of chip-testing arrangements have been described.

Finally, an arrangement for extending the scheme to allow also on-module testing of the individual chips, a novel feature which provides a powerful tool for module diagnosis, has been presented.

A general summary of the various arrangements and approaches for the testing scheme is given in FIG. 14. The scheme should be applicable to the testing of LSI logic chips fabricated in any circuit technology.

It is believed that the testing scheme will, at the price of some moderate wafer real-estate expenditure, allow great savings to be made in the costs of test equipment and testing time. Through the proposed extensions in chip-image design which will make on-module chip testing also practicable, the existing concept of LSSD testing has been greatly improved upon, in that the dependence of the testability of all parts of a system upon the proper functioning of all the latches in the system can be drastically reduced and that a faster and finer location of hardware malfunctions will be feasible.

The industrial applicability of the chip and wafer configuration and testing method for LSI circuits described above are believed to be obvious. LSI Chips, designed incorporating the configuration and testing method suggested by the invention, will be testable on-wafer and later on also on-module, which it may be expected will greatly simplify and facilitate the testing and debugging of chips, modules and systems and will thus greatly help to reduce their manufacturing costs.

While the invention has been particularly shown and described with reference to a preferred embodiment thereof, it will be understood by those skilled in the art that the foregoing and other changes in form and details may be made therein without departing from the spirit and scope of the invention.

Having thus described my invention, what I claim as new, and desire to secure by Letters Patent is:

1. A circuit configuration for facilitating the testing of individual chips fabricated on wafers produced by large-scale-integrated circuit manufacturing techniques, wherein each wafer is composed of a plurality of individual chips arranged in an array configuration along two axes of said wafer, said array comprising M rows and N columns of chips, each said chip comprising a chip image which includes a chip core containing the functional circuitry to be utilized on-module subsequent to the dicing of the wafer, each said chip core comprising at least one combinatorial network, and at least one set of LSSD storage latches, wherein an LSSD storage latch set is defined as a storage register capable of being selectively operated in a parallel or serial mode, said chip images being larger than the contained chip cores and being located contiguously on said wafer in said array configuration so as to define chip image boundaries therebetween, each said chip image further containing, exterior to said chip core, connection means and logic circuitry for selectively gating test data to and from said latches located within the chip cores, said connection means being interconnected on said wafer and between the respective chip images to also selectively transmit data stored in said latches in individual chips serially across selected chip image boundaries along at least one axis of the wafer, said connection means being configured to interconnect said latches along said at least one axis and across said chip image boundaries to effectively form a single serial shift register having a plurality of sets of latches and means for serially shifting the entire contents of the said shift register out of said wafer for LSSD testing purposes.

2. An on-wafer large-scale-integrated circuit configuration as set forth in claim 1 wherein said logic circuitry includes supplementary latches to augment the LSSD latch set and switching circuits for controlling data flow to and from said latch set.

3. An on-wafer large-scale-integrated circuit configuration as set forth in claim 1, wherein said connection means includes means for interconnecting said chip images across the chip image boundaries wherein the combinatorial network on a given chip may be connected to the latch set on that chip as one set of I/O latches and the latch set on at least one adjacent chip as the other set of I/O latches.

4. An on-wafer large-scale-integrated circuit configuration as set forth in claim 2 wherein said interconnection means includes means for selectively connecting the latch set on a particular chip to serve as both the input latch set and output latch set for the combinatorial network contained on said chip and wherein said switching circuits include means for controlling the data flow between the input and output of said combinatorial networks during the on-wafer functional testing of said combinatorial network.

5. An on-wafer large-scale-integrated circuit configuration as set forth in claim 2 above, including means to control said latch set for gating in parallel test data into and out of said latch set when testing said combinatorial networks and for serially gating the data out of said latch sets in contiguous chips to access the contents of said latch sets for subsequent comparison purposes.

6. An on-wafer large-scale-integrated circuit configuration as set forth in claim 4 above wherein the latches $N_l$ on each chip comprising the latch set have a minimum bit storage capacity represented by the formula $N_l = N_i \Gamma N_o$ where:

$N_i$ = number of data input lines to its associated combinatorial network $N_o$ = number of data output lines from its associated combinatorial network.

7. An on-wafer large-scale-integrated circuit configuration as set forth in claim 6 above including supplementary latches in said chip-image region exterior to said chip core when the number of latches in the chip core is insufficient to meet the storage requirements ($N_l$) of the associated combinatorial network for testing purposes.

8. An on-wafer large-scale-integrated circuit configuration as set forth in claim 5 including wafer-pad connections on said wafer traversing the chip image boundaries for powering all of the chips in common.

9. An on-wafer large-scale-integrated circuit configuration as set forth in claim 3 including wafer-pad connections for selectively powering whereby a latch set located in a neighbor chip may be selectively utilized for storing the input to or output from a combinatorial network in a different chip column.

10. An on-wafer large-scale-integrated circuit configuration as set forth in claim 3 above wherein the latch set on a particular chip is utilized to input data to its associated combinatorial network and said logic circuitry includes selectively operable switching means connected across the parallel input lines to said latch set, said switching means connecting one set of data input lines to said latch set during the operation-mode of said chip on-module and connecting another set of data input lines to said latches during the on-wafer test operations.

11. An on-wafer large-scale-integrated circuit configuration as set forth in claim 3 above wherein the latch set on a particular chip is utilized to receive data in parallel, from an associated combinatorial network selectively operable and said logic circuitry includes switching means connected across the parallel input lines to said combinatorial network, said switching means connecting one set of data input lines to said combinatorial network during the operating mode of said chip on-module and connecting another set of input lines to said combinatorial network during the on-wafer test operations.

12. An on-wafer large-scale-integrated circuit configuration as set forth in claim 10 wherein parallel data lines are provided traversing the chip boundaries for connecting the parallel data out lines from the combinatorial newtwork on one chip to the switching means for selecting the parallel latch set inputs on more than one other chip on said wafer.

13. An on-wafer large-scale-integrated circuit configuration as set forth in claim 11 wherein parallel data lines are provided traversing the chip boundaries for connecting the parallel data out lines from the latch set on one chip to the switching means for selecting the parallel data inputs to the combinatorial networks on more than one other chip on said wafer.

14. A method for fabricating and testing on-wafer individual circuit chips on a wafer fabricated by large-scale-integrated circuit manufacturing techniques said chips being organized in an array of chips adapted to be diced and used individually on-module subsequently, each chip comprising a chip core containing an LSSD latch set and combinatorial network circuitry to be used on-module, and a chip image including said chip core and further containing logic circuitry and lines for interconnecting said chip image in the array configuration on-wafer to selectively connect the latch set and combinatorial network on said chip image to those on adjacent chip images to form an LSSD shift register comprising all of said latch sets, said method comprising the steps of:

testing the latch sets for serial input and output including selecting on-wafer the chips to be tested, initially loading the latch sets with predetermined test-data patterns and serially shifting said patterns through said latch sets, determining their operability by comparing the serially received data from said latch sets with the test patterns, keeping a record of any latch sets which are defective and indicating that the chip containing said latch set is defective to preclude the further testing of said chip, testing the combinatorial networks by a sequence of selected-pattern-test steps, each said test step comprising loading a selected test pattern into the input latch sets for a particular set of chips under test, causing a logic cycle to run through the selected combinatorial networks, storing the output for said selected combinatorial networks in a designated output latch sets, serially shifting out the contents of said latch sets and comparing them with a "correct" pattern, and keeping a record of any deviations from said "correct" pattern to indicate that a particular chip is defective, and repeating said test steps with further sequences of selected-pattern until the logic circuitry in said combinatorial networks has been sufficiently tested, subsequently dicing the chips along the chip image boundaries and discarding chips which have been found to be defective.

15. A method as set forth in claim 14 above including performing said dicing operation to remove all but the circuitry and connection pads contained in the chip cores.

16. A method as set forth in claim 14 above including performing said dicing operation to retain all the circuitry contained in chip image other than conductive lines crossing chip image boundaries.

17. A method as set forth in claim 14 above including performing said dicing operation to retain all the circuitry in both the chip core and the chip image other than the conductive lines crossing chip image boundaries and retaining pad connections on the diced chip to both the circuitry in the chip core and also in the chip image external to said chip core, whereby the circuitry in said chip image may be subsequently used for on-module LSSD testing of the chips, connected-in-system environment.

* * * * *